United States Patent
Heo et al.

(10) Patent No.: US 12,260,800 B2
(45) Date of Patent: Mar. 25, 2025

(54) PIXEL AND DISPLAY DEVICE INCLUDING THE SAME

(71) Applicant: Samsung Display Co., Ltd., Yongin-si (KR)

(72) Inventors: Sang Hyun Heo, Yongin-si (KR); Joon Chul Goh, Yongin-si (KR); Oh Jo Kwon, Yongin-si (KR); Dong Soo Kim, Yongin-si (KR); Hyung Gun Ma, Yongin-si (KR); Jung Hun Yi, Yongin-si (KR)

(73) Assignee: Samsung Display Co., Ltd., Yongin-Si (KR)

( * ) Notice: Subject to any disclaimer, the term of this patent is extended or adjusted under 35 U.S.C. 154(b) by 0 days.

(21) Appl. No.: 18/611,074

(22) Filed: Mar. 20, 2024

(65) Prior Publication Data

US 2025/0006097 A1    Jan. 2, 2025

(30) Foreign Application Priority Data

Jun. 27, 2023    (KR) ........................ 10-2023-0082999

(51) Int. Cl.
*G09G 3/20*        (2006.01)
*G09G 3/3233*    (2016.01)
*H10K 59/131*    (2023.01)

(52) U.S. Cl.
CPC ......... *G09G 3/2007* (2013.01); *G09G 3/3233* (2013.01); *H10K 59/131* (2023.02);
(Continued)

(58) Field of Classification Search
CPC .. H10K 59/131; G09G 3/2007; G09G 3/3233; G09G 3/2096; G09G 2300/0819;
(Continued)

(56) References Cited

U.S. PATENT DOCUMENTS

| 8,436,793 B2 | 5/2013 | Yamamoto |
| 10,622,429 B2 | 4/2020 | Yu et al. |

(Continued)

FOREIGN PATENT DOCUMENTS

| EP | 3534358 A1 | 9/2019 |
| KR | 10-20210143729 A | 11/2021 |

(Continued)

*Primary Examiner* — Sejoon Ahn
(74) *Attorney, Agent, or Firm* — Innovation Counsel LLP

(57) ABSTRACT

A pixel may include: a first transistor including a second electrode, a first electrode electrically connected to a first power line, and a gate electrode connected to a first node; a second transistor including a second electrode, a first electrode electrically connected to a data line, and a gate electrode electrically connected to a first scan line; a third transistor connected between the first node and the data line, and including a gate electrode electrically connected to a second scan line; a first capacitor including a first electrode connected to the second electrode of the second transistor, and a second electrode connected to the first node; a second capacitor connected between the first power line and the first node; and a light emitting element between a second power line and the first transistor, and including a second electrode electrically connected to the second power line.

20 Claims, 15 Drawing Sheets

(52) U.S. Cl.
CPC ... *G09G 3/2096* (2013.01); *G09G 2300/0819* (2013.01); *G09G 2300/0852* (2013.01); *G09G 2300/0861* (2013.01); *G09G 2310/08* (2013.01)

(58) Field of Classification Search
CPC ... G09G 2300/0852; G09G 2300/0861; G09G 2310/08
See application file for complete search history.

(56) References Cited

U.S. PATENT DOCUMENTS

| | | | |
|---|---|---|---|
| 11,476,308 B2 | 10/2022 | Akimoto | |
| 12,039,933 B2 | 7/2024 | Kim et al. | |
| 2012/0019505 A1* | 1/2012 | Hwang | G09G 3/3233 345/82 |
| 2014/0014912 A1 | 1/2014 | Kim et al. | |
| 2022/0115484 A1 | 4/2022 | Lu et al. | |
| 2022/0180813 A1 | 6/2022 | Yang et al. | |
| 2022/0309984 A1* | 9/2022 | Xi | G09G 3/2007 |
| 2022/0310006 A1* | 9/2022 | Yu | G09G 3/3225 |
| 2022/0310708 A1* | 9/2022 | Dai | H10K 59/131 |
| 2022/0310723 A1* | 9/2022 | Wang | H10K 59/131 |
| 2022/0310755 A1* | 9/2022 | Wei | H01L 27/124 |
| 2022/0310757 A1* | 9/2022 | Li | H01L 27/1214 |

FOREIGN PATENT DOCUMENTS

| | | |
|---|---|---|
| KR | 102332646 B1 | 11/2021 |
| WO | 2022164078 A1 | 8/2022 |

\* cited by examiner

PIXEL AND DISPLAY DEVICE INCLUDING THE SAME

CROSS-REFERENCE TO RELATED APPLICATION

The present application claims priority to Korean patent application number 10-2023-0082999 filed on Jun. 27, 2023, the disclosure of which is incorporated herein in its entirety by reference.

BACKGROUND

Field of Invention

Various embodiments of the present disclosure relate to a pixel and a display device including the pixel.

Description of Related Art

Display devices, such as liquid crystal display devices and organic light-emitting display devices, have become increasingly important as information technology has developed. Recently, there has been development in head mounted display devices (HMDs). Head mounted display devices (HMDs) are display devices that users can wear in the form of glasses or helmets, and HMDs are commonly used to create virtual reality (VR) or augmented reality (AR) experiences where a focus is formed a short distance in front of the eyes of the user. Head mounted display devices accordingly may employ high-resolution panels, requiring pixels that suitable for the high-resolution panels.

SUMMARY

Various embodiments of the present disclosure are directed to a pixel, which can be applied to a high-resolution panel, and a display device including the pixel.

An embodiment of the present disclosure may provide a pixel including: a first transistor including a second electrode, a first electrode electrically connected to a first power line, and a gate electrode connected to a first node; a second transistor including a second electrode, a first electrode electrically connected to a data line, and a gate electrode electrically connected to a first scan line; a third transistor connected between the first node and the data line, and including a gate electrode electrically connected to a second scan line; a first capacitor including a first electrode connected to the second electrode of the second transistor, and a second electrode connected to the first node; a second capacitor connected between the first power line and the first node; and a light emitting element positioned between a second power line and the first transistor, and including a second electrode electrically connected to the second power line.

In an embodiment, the first transistor may include a metal-oxide-semiconductor field-effect transistor (MOSFET) including a body electrode.

In an embodiment, a voltage of first driving power may be supplied to the first power line, and the voltage of the first driving power may be supplied to the body electrode.

In an embodiment, the pixel may further include: a fourth transistor connected between the first node and a second node connected to the second electrode of the first transistor, and including a gate electrode electrically connected to a third scan line; a fifth transistor connected between the second node and a first electrode of the light emitting element, and including a gate electrode electrically connected to an emission control line; and a sixth transistor including a first electrode electrically connected to the first electrode of the light emitting element, a second electrode electrically connected to a third power line, and a gate electrode electrically connected to a fourth scan line.

In an embodiment, each of the first to the sixth transistors may include a metal-oxide-semiconductor field-effect transistor (MOSFET) including a body electrode.

In an embodiment, a voltage of first driving power may be supplied to the first power line, and the voltage of the first driving power may be supplied to the body electrode.

In an embodiment, the second scan line may be set to a third scan line positioned on a previous horizontal line.

In an embodiment, first driving power may be supplied to the first power line. Second driving power having a voltage value lower than the first driving power may be supplied to the second power line. Initialization power having a voltage value at which the light emitting element does not emit light may be supplied to the third power line.

In an embodiment, a voltage value acquired by subtracting the second driving power from a voltage obtained by adding an absolute threshold voltage of the fifth transistor to a voltage of the initialization power may be set to a voltage lower than a threshold voltage of the light emitting element.

In an embodiment, the initialization power may be set to ground power (GND).

In an embodiment, a single horizontal period may include a first period and a second period. Reference power having a voltage value between the first driving power and the second driving power may be supplied to the data line during the first period, and a voltage of a data signal may be supplied to the data line during the second period. During the first period, the second transistor, the fourth transistor, and the sixth transistor may be set to a turn-on state, and the third transistor and the fifth transistor may be set to a turn-off state. During the second period, the second transistor and the sixth transistor may be set to the turn-on state, and the third transistor, the fourth transistor, and the fifth transistor may be set to the turn-off state.

In an embodiment, during a zeroth period before the first period, the third transistor and the sixth transistor may be set to the turn-on state, and the second transistor, the fourth transistor, and the fifth transistor may be set to the turn-off state. During the zeroth period, a voltage of the reference power may be supplied to the data line.

In an embodiment, during a third period after the second period, the first transistor, the fifth transistor, and the sixth transistor may be set to the turn-on state, and the second transistor, the third transistor, and the fourth transistor may be set to the turn-off state. During a fourth period after the third period, the first transistor and the fifth transistor may be set to the turn-on state, and the second transistor, the third transistor, the fourth transistor, and the sixth transistor may be set to the turn-off state.

An embodiment of the present disclosure may provide a pixel including: a light emitting element including a second electrode electrically connected to a second power line; a first transistor including a second electrode, a first electrode electrically connected to a first power line, and a gate electrode connected to a first node; a second transistor including a second electrode, a first electrode electrically connected to a data line, and a gate electrode electrically connected to a first scan line; a third transistor including a first electrode connected to the first node, a second electrode electrically connected to a fourth power line to which a voltage of reference power is supplied, and a gate electrode electrically connected to the second scan line; a fourth transistor connected between the first node and a second node connected to the second electrode of the first transistor, and including a gate electrode electrically connected to a third scan line; a fifth transistor connected between the second node and a first electrode of the light emitting element, and including a gate electrode electrically connected to an emission control line; a sixth transistor including a first electrode electrically connected to the first electrode of the light emitting element, a second electrode electrically connected to a third power line, and a gate electrode electrically connected to a fourth scan line; a first capacitor connected between the second electrode of the second transistor and the first node; and a second capacitor connected between the first power line and the first node.

An embodiment of the present disclosure may provide a display device, including pixels connected to first scan lines, second scan lines, third scan lines, fourth scan lines, data lines, and emission control lines. Among the pixels, a pixel positioned on an i-th pixel row (i is an integer of 0 or more) and a j-th pixel column (j is an integer of 0 or more) may include: a first transistor including a second electrode, a first electrode electrically connected to a first power line, and a gate electrode connected to a first node; a second transistor including a second electrode, and a first electrode electrically connected to a j-th data line, and configured to be turned on when a first scan signal is supplied to an i-th first scan line; a third transistor connected between the first node and the j-th data line, and configured to be turned on when a second scan signal is supplied to an i-th second scan line; a first capacitor connected between the second electrode of the second transistor and the first node; a second capacitor connected between the first power line and the first node; and a light emitting element positioned between a second power line and the first transistor, and including a second electrode electrically connected to the second power line.

In an embodiment, the first transistor may be set to a metal-oxide-semiconductor field-effect transistor (MOSFET) including a body electrode, and the body electrode may be electrically connected to the first power line.

In an embodiment, the pixel positioned on the i-th pixel row and the j-th pixel column may further include: a fourth transistor connected between a second node connected to the second electrode of the first transistor and the first node, and configured to be turned on when a third scan signal is supplied to an i-th third scan line; a fifth transistor connected between the second node and a first electrode of the light emitting element, and configured to be turned off when an emission control signal is supplied to a k-th emission control line (where k is an integer of 0 or more); and a sixth transistor including a first electrode electrically connected to the first electrode of the light emitting element, and a second electrode electrically connected to a third power line, and configured to turned of when a fourth scan signal is supplied to an i-th fourth scan line.

In an embodiment, each of the first to the sixth transistors may be set to a metal-oxide-semiconductor field-effect transistor (MOSFET) including a body electrode, and the body electrode may be electrically connected to the first power line.

In an embodiment, the display device may further include: a data driver configured to supply a data signal to the data lines; a first scan driver configured to supply the first scan signal to the first scan lines; a second scan driver configured to supply the second scan signal to the second scan lines; a third scan driver configured to supply the third scan signal to the third scan lines; a fourth scan driver configured to supply the fourth scan signal to the fourth scan lines; and an emission driver configured to supply the emission control signal to the emission control lines.

In an embodiment, a horizontal period in which the pixel positioned on the i-th pixel row and the j-th pixel column is driven may include a first period and a second period. The data driver may supply a voltage of reference power to the j-th data line during the first period and supply the data signal to the j-th data line during the second period. The first scan driver may supply the first scan signal to the i-th first scan line during the first period and the second period. The second scan driver may supply the second scan signal to the i-th second scan line during a zeroth period before the first period. The third scan driver may supply the third scan signal to the i-th third scan line during the first period. The fourth scan driver may supply the fourth scan signal to the i-th fourth scan line during the zeroth period, the first period, the second period, and a third period after the second period. The emission driver may supply the emission control signal to the k-th emission control line during the zeroth period, the first period, and the second period.

The objects of the present disclosure are not limited to the above-stated object, and those skilled in the art will clearly understand other not mentioned objects from the accompanying claims.

DETAILED DESCRIPTION

Figure 1:
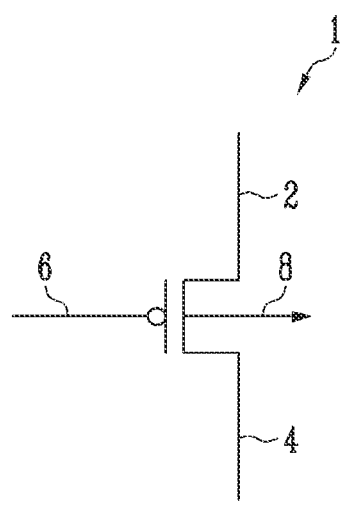
FIG. 1 is a diagram illustrating a transistor in accordance with an embodiment of the present disclosure.

Hereinafter, embodiments will be described in detail with reference to the attached drawings, such that those skilled in the art can easily implement the disclosed embodiments. The present disclosure may be implemented in various forms and is not limited to the embodiments to be described herein below.

In the drawings, portions which are not related to the present disclosure may be omitted in order to explain the present disclosure more clearly. Reference should be made to the drawings, in which similar reference numerals are used throughout the different drawings to designate similar components. Therefore, the aforementioned reference numerals may be used in other drawings.

For reference, the size of each component and the thicknesses of lines illustrating the component may be arbitrarily represented for the sake of explanation, and the present disclosure is not limited to what is illustrated in the drawings. In the drawings, the thicknesses of the components may be exaggerated to clearly depict multiple layers and areas.

Furthermore, the expression "being the same" may mean "being substantially the same." In other words, the expression "being the same" may include a range that can be tolerated. The other expressions may also be expressions from which the term "substantially" has been omitted.

Some embodiments are illustrated in the accompanying drawings and described in connection with functional blocks, units and/or modules. Those skilled in the art will understand that such blocks, units, and/or modules may be physically implemented by logic circuits, discrete components, microprocessors, hard-wired circuits, memory elements, line connections, and other electronic circuits. These may be formed using semiconductor-based fabrication techniques or other fabrication techniques. Blocks, units, and/or modules implemented by a microprocessor or other similar hardware may be programmed and controlled using software to perform various functions discussed herein and may be optionally driven by firmware and/or software. In addition, each block, unit, and/or module may be implemented by dedicated hardware or be implemented by a combination of the dedicated hardware which performs some functions and a processor which performs different functions (e.g., one or more programmed microprocessors and related circuits). Furthermore, in some embodiments, a block, unit and/or module may be physically separated into two or more individual blocks, units and/or modules which interact with each other without departing from the scope of the present disclosure. In some embodiments, blocks, units and/or modules may be physically combined into more complex blocks, units and/or modules without departing from the scope of the inventive concept.

The term "connection" between two components may embrace electrical connection and physical connection, but the present disclosure is not limited thereto. For example, the term "connection" used in description with reference to a circuit diagram may refer to electrical connection, and the term "connection" used in description with reference to a sectional view or a plan view may refer to physical connection.

It will be understood that, although the terms "first", "second", etc. may be used herein to describe various elements, these elements should not be limited by these terms. These terms are only used to distinguish one element from another element. For instance, a first element discussed below could be termed a second element without departing from the teachings of the present disclosure.

The present disclosure is not limited to the following embodiments and may be modified into various forms. Each embodiment to be described below may be implemented alone or combined with at least another embodiment to make various combinations of embodiments.

FIG. 1 shows a transistor 1 in accordance with an embodiment of the present disclosure.

Referring to FIG. 1, the transistor 1 may include a first electrode 2, a second electrode 4, a gate electrode 6, and a body electrode 8. For example, the transistor 1 may be a metal-oxide-semiconductor field-effect transistor (MOSFET). The transistor 1 (e.g., a MOSFET) including a body electrode 8 may be suitable for implementing a high-resolution pixel due to a reduced mounting area thereof.

The transistor 1 may be formed on a silicon wafer. For example, a panel implemented by stacking layers such as a transistor layer, an emission layer, and a cover layer on the silicon wafer. However, the foregoing description is illustrative, and the transistor 1 may be formed on various known substrates (e.g., a glass substrate).

The first electrode 2 of the transistor 1 may be set to a source electrode (or a drain electrode), and the second electrode 4 thereof may be set to a drain electrode (or a source electrode). In the case where the transistor 1 includes the body electrode 8, a threshold voltage of the transistor 1 may be changed by the body effect. The body effect refers to a change in the threshold voltage of the transistor 1 due to a voltage difference between the body electrode 8 and the first electrode 2 of the transistor 1. For example, as the voltage difference (e.g., VBS) between the body electrode 8 and the first (e.g., source) electrode 2 increases, the threshold voltage of the transistor 1 may also increase.

In a driving transistor of a pixel, the first electrode 2 and the body electrode 8 of the transistor 1 may be required to be set to the same voltage during a threshold voltage compensation period and an emission period. However, different voltages are generally supplied to the first electrode of the driving transistor during the threshold voltage compensation period and the emission period. In this case, if no body electrode is used, the threshold voltage of the driving transistor during the threshold voltage compensation period is set to a value different from the threshold voltage of the driving transistor during the emission period. As a result, the threshold voltage of the driving transistor may not be compensated for. Therefore, in embodiments of the present disclosure, a pixel uses the transistor 1 including the body electrode 8 as a driving transistor and is able to compensate for threshold voltage.

Figure 2:
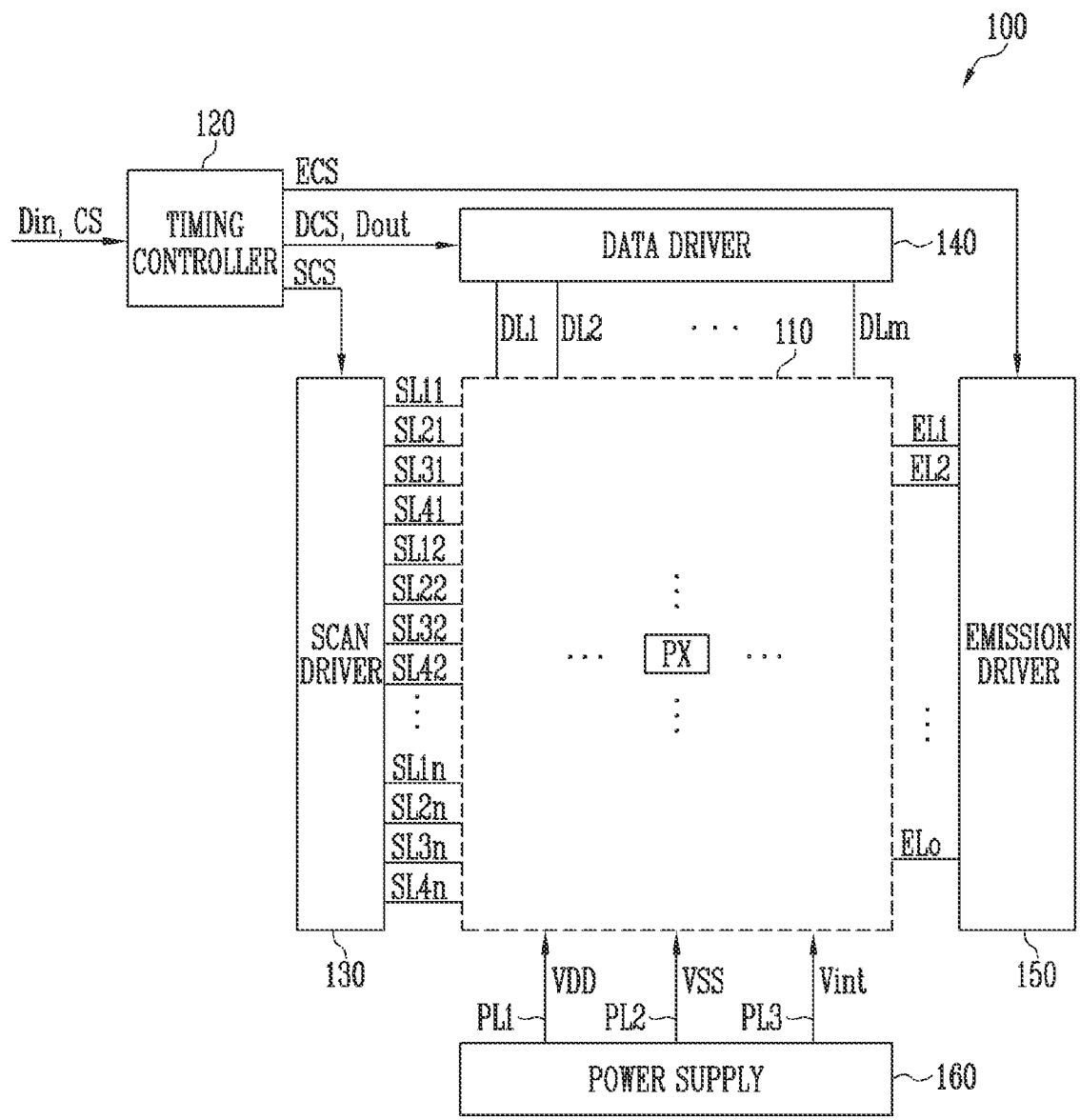
FIG. 2 is a diagram illustrating a display device in accordance with an embodiment of the present disclosure.
Figure 3:
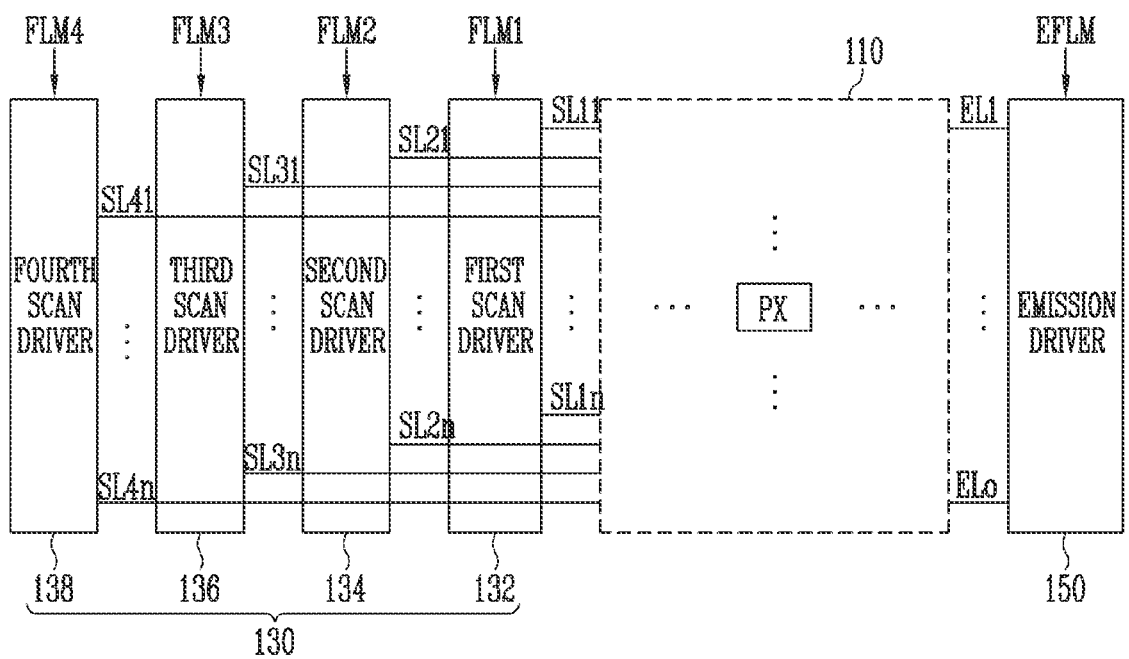
FIG. 3 is a diagram illustrating an embodiment of a scan driver and an emission driver that are illustrated in FIG. 2.

FIG. 2 shows a display device 100 in accordance with an embodiment of the present disclosure. FIG. 3 shows an embodiment of a scan driver 130 and an emission driver 150 that are illustrated in FIG. 2.

Referring to FIG. 2, the display device 100 in accordance with an embodiment of the present disclosure may include a pixel component 110 (or a panel), a timing controller 120, the scan driver 130, a data driver 140, the emission driver 150, and a power supply 160. The aforementioned components may be implemented as separate integrated circuits. Two or more of the aforementioned components may be implemented in a single integrated circuit. The scan driver 130 and the emission driver 150 may be included in the pixel component 110.

The pixel component 110 may include pixels PX connected to first scan lines SL11, SL12, ... SL1n, second scan lines SL21, SL22, ... SL2n), third scan lines SL31, SL32, ... SL3n, fourth scan lines SL41, SL42, ... SL4n, data lines DL1, DL2, ... DLm, emission control lines EL1, EL2, ... ELo, and power lines PL1, PL2, and PL3 (where n, m, and o are integers greater than or equal to 0).

Pixels PX may form an array. For example, a pixel PXij (refer to FIG. 4) positioned on an i-th horizontal line (or pixel row) and a j-th vertical line (or pixel column) may be connected to an i-th first scan line SL1i, an i-th second scan line SL2i, an i-th third scan line SL3i, an i-th fourth scan line SL4i, a k-th emission control line ELk, and j-th data line DLj (where i is an integer less than or equal to n, j is an integer less than or equal to m, and k is an integer less than or equal to o). Here, k is an integer less than or equal to i. For example, in the case where each of the emission control lines EL1 to ELo is connected to pixels PX positioned on one horizontal line, k is a number identical to i. For example, in the case where each of the emission control lines EL1 to ELo is connected to pixels PX positioned on two or more horizontal lines, k is a number less than i.

The pixels PX may be selected on a horizontal line basis {e.g., pixels PX connected to the same scan line may be grouped into one horizontal line (or pixel row)} when a first scan signal is supplied to the first scan lines SL11 to SL1n. Each of the pixels PX that are selected by the first scan signal may receive a data signal from a corresponding data line (one of DL1 to DLm) connected to the pixel PX. The pixels PX that receive data signals may generate certain levels of luminance of light in response to voltages of the data signals.

The scan driver 130 may receive a scan driving control signal SCS from the timing controller 120. The scan driving signal SCS may include at least one scan start signal and clock signals required for driving the scan driver 130. The scan driver 130 may generate a first scan signal, a second scan signal, a third scan signal, and a fourth scan signal while shifting the scan start signal in response to the clock signals.

To achieve the foregoing purpose, as illustrated in FIG. 3, the scan driver 130 may include a first scan driver 132, a second scan driver 134, a third scan driver 136, and a fourth scan driver 138.

The first scan driver 132 may receive a first scan start signal FLM1 and generate first scan signals while shifting the first scan start signal FLM1 in response to a clock signal. The first scan driver 132 may sequentially supply the first scan signals to the first scan lines SL11 to SL1n among first scan lines SL1.

The second scan driver 134 may receive a second scan start signal FLM2 and generate second scan signals while shifting the second scan start signal FLM2 in response to a clock signal. The second scan driver 134 may sequentially supply the second scan signals to the second scan lines SL21 to SL2n among second scan lines SL2.

The third scan driver 136 may receive a third scan start signal FLM3 and generate third scan signals while shifting the third scan start signal FLM3 in response to a clock signal. The third scan driver 136 may sequentially supply the third scan signals to the third scan lines SL31 to SL3n among third scan lines SL3.

The fourth scan driver 138 may receive a fourth scan start signal FLM4 and generate fourth scan signals while shifting the fourth scan start signal FLM4 in response to a clock signal. The fourth scan driver 138 may sequentially supply the fourth scan signals to the fourth scan lines SL41 to SL4n among fourth scan lines SL4.

Each of the first scan signals, the second scan signals, the third scan signals, and the fourth scan signals may be set to a gate-on voltage to allow transistors included in the pixels PX to be turned on.

For example, a first scan signal, a second scan signal, a third scan signal, and a fourth scan signal of a low level may be supplied to a P-type transistor. A first scan signal, a second scan signal, a third scan signal, and a fourth scan signal of a high level may be supplied to an N-type transistor. The transistors supplied with the first scan signal, the second scan signal, the third scan signal, or the fourth scan signal may be turned on in response to the first scan signal, the second scan signal, the third scan signal, or the fourth scan signal.

The supply of the first scan signal, the second scan signal, the third scan signal, or the fourth scan signal to one of the first, second, third, or fourth scan lines SL1, SL2, SL3, or SL4 may mean that a gate-on voltage is supplied to the first scan line SL1, the second scan line SL2, the third scan line SL3, or the fourth scan line SL4. No-supply of the first scan signal, the second scan signal, the third scan signal, or the fourth scan signal may mean that a gate-off voltage is supplied to the first scan line SL1, the second scan line SL2, the third scan line SL3, or the fourth scan line SL4.

Although FIG. 3 illustrates that the first scan driver 132, the second scan driver 134, the third scan driver 136, and the fourth scan driver 138 are respectively connected with the first scan lines SL1, the second scan lines SL2, the third scan lines SL3, and the fourth scan lines SL4, embodiments of the present disclosure are not limited thereto. For example, a single scan driver may be connected to and drive two or more of the first scan lines SL1, the second scan lines SL2, the third scan lines SL3, and the fourth scan lines SL4. In particular, at least two of SL1, SL2, SL3, and SL4 may be driven by a single scan driver.

The data driver 140 of FIG. 2 may receive output data Dout and a data driving signal DCS from the timing controller 120. The data driving signal DCS may include a sampling signal and/or timing signals required for driving the data driver 140. The data driver 140 may generate data signals, based on the data driving signal DCS and the output data Dout. For example, the data driver 140 may generate an analog data signal, based on a grayscale or intensity value of the output data Dout. The data driver 140 may sequentially supply a voltage of reference power Vref and voltages Vdata of data signals to the data lines DL1 to DLm during one horizontal period 1H (refer to FIG. 5). The reference power Vref may be set as a constant voltage.

The emission driver 150 may receive an emission driving signal ECS from the timing controller 120. The emission driving signal ECS may include an emission start signal and clock signals required for driving the emission driver 150. The emission driver 150 may generate emission control signals EM (refer to FIG. 4 or 5) while shifting the emission start signal in response to a clock signal.

For example, as illustrated in FIG. 3, the emission driver 150 may receive an emission start signal EFLM and generate emission control signals EM while shifting the emission start signal EFLM in response to a clock signal. The emission driver 150 may successively supply the emission control signal to the emission control lines EL1 to ELo. The emission control signal may be set to a gate-off voltage, thus allowing transistors included in the pixels PX to be turned off.

For example, an emission control signal of a high level may be supplied to a P-type transistor, and an emission control signal of a low level may be supplied to an N-type transistor. A transistor supplied with an emission control signal may be turned off in response to the emission control signal. Thereafter, the supply of the emission control signal to one of the emission control lines EL may mean that a gate-off voltage is supplied to the emission control line EL. No supply of the emission control signal may indicate that a gate-on voltage is supplied to the emission control line EL.

The timing controller 120 may receive input data Din and a control signal CS from a host system through an interface. For example, the timing controller 120 may receive input data Din and a control signal CS from at least one of a graphics processing unit (GPU), a central processing unit (CPU), and an application processor (AP) that are included in the host system. The control signal CS may include various signals including a clock signal.

The timing controller 120 may generate the scan driving signal SCS, the data driving signal DCS, and the emission driving signal ECS, based on the control signal CS. The scan driving signal SCS, the data driving signal DCS, and the emission driving signal ECS may be respectively supplied to the scan driver 130, the data driver 140, and the emission driver 150 as described above.

The timing controller 120 may rearrange the input data Din to match specifications of the display device 100. Furthermore, the timing controller 120 may correct the input data Din to generate output data Dout and supply the output data Dout to the data driver 140. In an embodiment, the timing controller 120 may correct the input data Din in response to optical measurement results obtained during a manufacturing process for the display device 100.

The power supply 160 may generate various power voltages required for driving the display device 100. For example, the power supply 160 may generate first driving power VDD, second driving power VSS, and initialization power Vint.

The first driving power VDD may be provided to supply driving current to the pixels PX. The second driving power VSS may be provided to receive the driving current from the pixels PX. During a period in which the pixels PX are set to an emission state, the first driving power VDD may be set to a voltage higher than that of the second driving power VSS.

The initialization power Vint may be a voltage provided to initialize a first electrode (or an anode electrode) of a light emitting element LD (refer to FIG. 4) included in each of the pixels PX. The initialization power Vint may have a voltage value causing the light emitting element LD to be turned off when supplied to the first electrode of the light emitting element LD. For example, the initialization power Vint may be set to a ground potential GND.

Generated from the power supply 160, the first driving power VDD may be supplied to the first power line PL1, the second driving power VSS may be supplied to the second power line PL2, and the initialization power Vint may be supplied to the third power line PL3. The first power line PL1, the second power line PL2, and the third power line PL3 may be connected in common to the pixels PX, but embodiments of the present disclosure are not limited thereto.

In an embodiment, the first power line PL1 may include a plurality of first power lines. The power lines may be connected to different pixels PX. In an embodiment, the second power line PL2 may include a plurality of second power lines. The second power lines may be connected to different pixels PX. In an embodiment, the third power line PL3 may be configured of a plurality of third power lines. The third power lines may be connected to different pixels PX. In other words, in an embodiment of the present disclosure, the pixels PX may be connected to any one of the first power lines PL1, any one of the second power lines PL2, and any one of the third power lines PL3.

Figure 4:
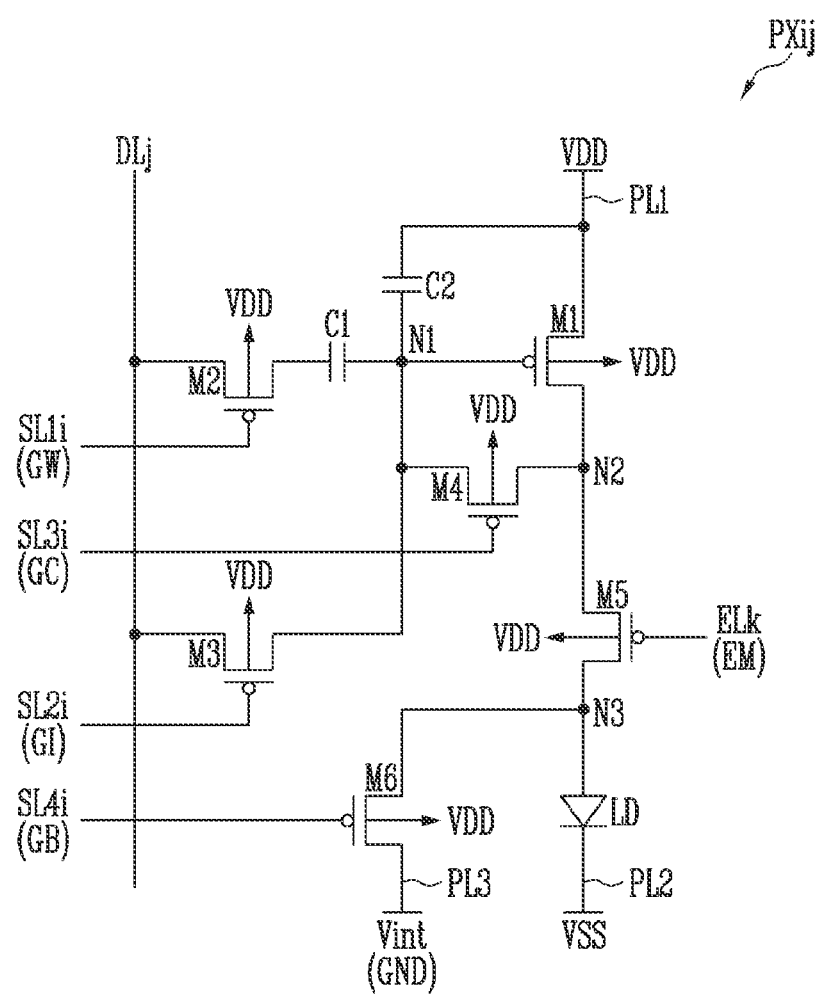
FIG. 4 is a diagram illustrating a pixel in accordance with an embodiment of the present disclosure.

FIG. 4 is an equivalent circuit diagram illustrating a pixel PXij in accordance with an embodiment of the present disclosure. In FIG. 4, the pixel PXij may represent a pixel PX positioned on an i-th horizontal line and a j-th vertical line in an array of the pixels PX.

Referring to FIG. 4, the pixel PXij in accordance with an embodiment of the present disclosure may be connected to corresponding signal lines SL1i, SL2i, SL3i, SL4i, ELk, and DLj. For example, the pixel PXij may be connected to the i-th first scan line SL1i, the i-th second scan line SL2i, the i-th third scan line SL3i, the i-th fourth scan line SL4i, the k-th emission control line Elk, and the j-th data line DLj. In an embodiment, the pixel PXij may also be connected to the first power line PL1, the second power line PL2, and the third power line PL3.

The pixel PXij in accordance with an embodiment of the present disclosure may include a light emitting element LD and a pixel circuit that is configured to control the amount of current to be supplied to the light emitting element LD.

The light emitting element LD may be connected between the first power line PL1 and the second power line PL2. For example, a first electrode (or an anode electrode) of the light emitting element LD may be electrically connected to the first power line PL1 via a third node N3, a fifth transistor M5, a second node N2, and a first transistor M1. A second electrode (or a cathode electrode) of the light emitting element LD may be electrically connected to the second power line PL2. The light emitting element LD may generate light of certain luminance corresponding to the amount of current that is supplied from the first power line PL1 to the light emitting element LD (or the second power line PL2) via the pixel circuit.

An organic light emitting diode may be selected as the light emitting element LD. Alternatively, an inorganic light emitting diode such as a micro light emitting diode (LED) or a quantum dot light emitting diode may be selected as the light emitting element LD. The light emitting element LD may be an element formed of a combination of organic material and inorganic material. Although FIG. 4 illustrates that the pixel PXij includes a single light emitting element LD, the pixel PXij in an embodiment may include a plurality of light emitting elements LD. The plurality of light emitting elements LD may be connected in series, parallel or series-parallel to each other.

The pixel circuit may include the first transistor M1, a second transistor M2, a third transistor M3, a fourth transistor M4, the fifth transistor M5, a sixth transistor M6, a first capacitor C1, and a second capacitor C2.

Each of the first to sixth transistors M1 to M6 may be a MOSFET including a body electrode. In this case, the first to sixth transistors M1 to M6 may be mounted in a relatively small area, thus allowing the pixel PXij to be applied to a high-resolution panel. The first to sixth transistors M1 to M6 may have respective body electrodes that are supplied with first driving power VDD. For example, the body electrodes of the first to sixth transistors M1 to M6 may be electrically connected to the first power line PL1.

In an embodiment, each of the first to sixth transistors M1 to M6 may be formed of a P-type transistor. However, this is illustrative, and at least one of the first to sixth transistors M1 to M6 may instead be an N-type transistor.

The first transistor M1 (which is a driving transistor) may include a first electrode electrically connected to the first power line PL1, and a second electrode connected to the second node N2. Here, the term "connected" implies being electrically linked or joined. A gate electrode of the first transistor M1 may be connected to a first node N1. The first transistor M1 may control, in response to the voltage of the first node N1, the amount of current to be supplied from the first driving power VDD to the second driving power VSS via the light emitting element LD.

The second transistor M2 may be connected between the data line DLj and a first electrode of the first capacitor C1. A gate electrode of the second transistor M2 may be electrically connected to the first scan line SL1i. When a first scan signal GW is supplied to the first scan line SL1i, the second transistor M2 may be turned on to electrically connect the data line DLj with the first electrode of the first capacitor C1.

The third transistor M3 may be connected between the data line DLj and the first node N1. A gate electrode of the third transistor M3 may be electrically connected to the second scan line SL2i. When a second scan signal GI is supplied to the second scan line SL2i, the third transistor M3 may be turned on to electrically connect the data line DLj with the first node N1.

The fourth transistor M4 may be connected between the first node N1 and the second node N2. A gate electrode of the fourth transistor M4 may be electrically connected to the third scan line SL3i. When a third scan signal GC is supplied to the third scan line SL3i, the fourth transistor M4 may be turned on to electrically connect the first node N1 and the second node N2. In this case, the gate electrode of the first transistor M1 (i.e., the first node N1) and the second electrode of the first transistor M1 (i.e., the second node N2) may be electrically connected to each other, thus enabling the first transistor M1 to be diode connected, i.e., connected to form or operate as a diode.

The fifth transistor M5 may be connected between the second node N2 and the third node N3 (i.e., the first electrode of the light emitting element LD). A gate electrode of the fifth transistor M5 may be electrically connected to the emission control line ELk. The fifth transistor M5 may be turned off when an emission control signal EM is supplied to the emission control line ELk and may be turned on when the emission control signal EM is not supplied to the emission control line ELk. If the fifth transistor M5 is turned off, the first transistor M1 and the light emitting element LD may be electrically disconnected from each other.

The sixth transistor M6 may include a first electrode connected to the third node N3, and a second electrode electrically connected to the third power line PL3. A gate electrode of the sixth transistor M6 may be electrically connected to the fourth scan line SL4i. The sixth transistor M6 may be turned on when a fourth scan signal GB is supplied to the fourth scan line SL4i. If the sixth transistor M6 is turned on, the voltage of the initialization power Vint may be supplied to the third node N3. Here, the initialization power Vint may be set to a ground potential GND.

The first electrode of the first capacitor C1 may be connected to the second electrode of the second transistor M2. A second electrode of the first capacitor C1 may be connected to the first node N1. The first capacitor may change the voltage of the first node N1 in response to a voltage supplied from the second transistor M2. For example, the first capacitor C1 may be driven as a coupling capacitor.

The second capacitor C2 may include a first electrode electrically connected to the first power line PL1, and a second electrode connected to the first node N1. In other words, the second capacitor C2 may be connected between the first power line PL1 and the first node N1. The second capacitor C2 may store or maintain the voltage of the first node N1, particularly when the second, third, and fourth transistors M2, M3, and M4 are turned off.

Figure 5:
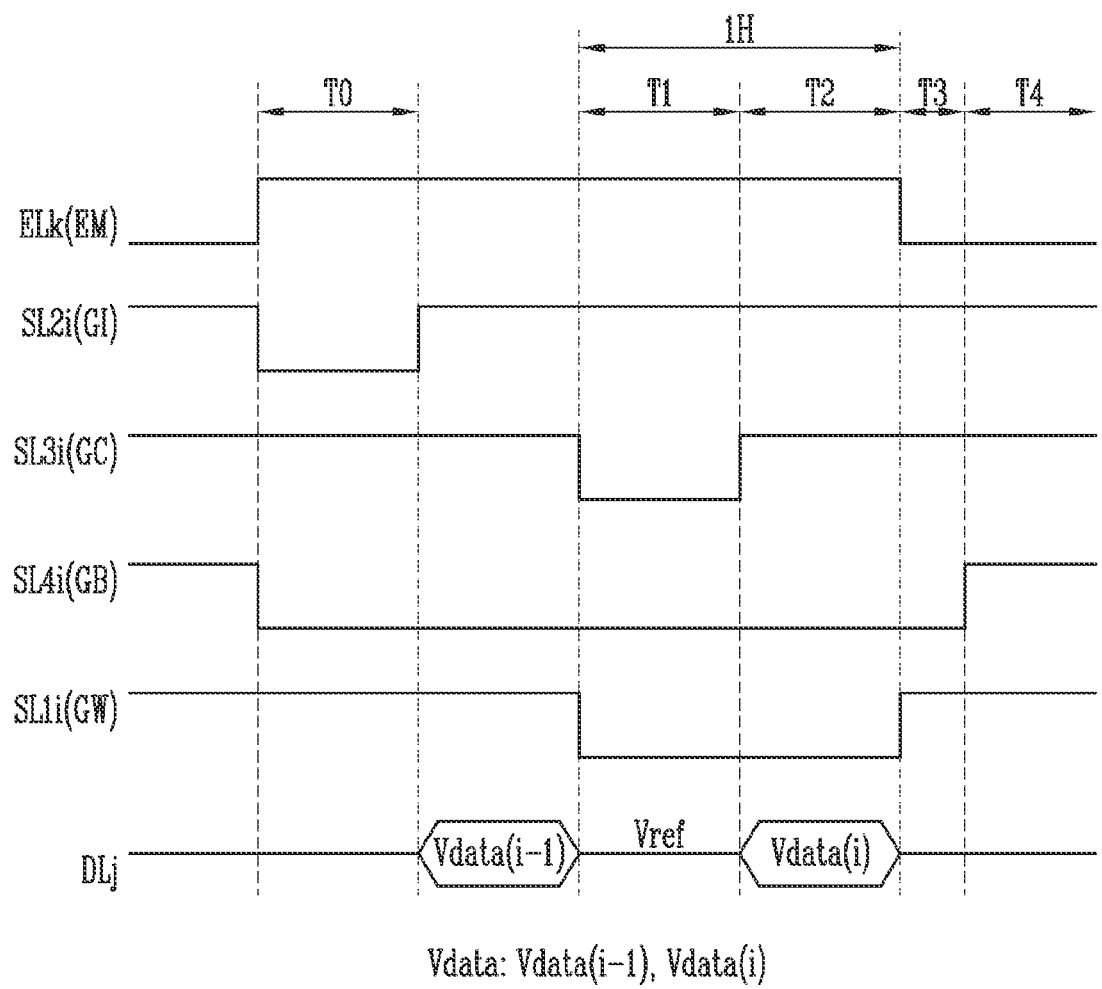
FIG. 5 is a waveform diagram illustrating an embodiment of a method of driving the pixel shown in FIG. 4.

FIG. 5 is a waveform diagram illustrating an embodiment of a method of driving the pixel PXij shown in FIG. 4.

Referring to FIG. 5, a horizontal period 1H (or a specific horizontal period) in which a data signal is supplied to the pixel PXij positioned on the i-th horizontal line and the j-th vertical line may be divided into a first period T1 and a second period T2.

The data driver 140 may supply the voltage of the reference power Vref to the data line DLj during the first period T1 and may supply a voltage Vdata(i) of a data signal to the data line DLj during the second period T2. The reference power Vref may be set to a voltage between the first driving power VDD and the second driving power VSS, for example, a specific voltage within a voltage range of the data signal. The voltage Vdata(i) of the data signal may be set to a voltage that corresponds to a grayscale value and is within the voltage range of the data signal.

The scan driver 130 (or the first scan driver 132) may supply a first scan signal GW to the first scan line SL1i during the first period T1 and the second period T2.

The scan driver 130 (or the second scan driver 134) may supply a second scan signal GI to the second scan line SL2i during a zeroth period T0 before the first period T1. The zeroth period T0 may be a period included in a previous horizontal period (e.g., a period in which data signals are supplied to the pixels positioned on an i-1-th horizontal line).

The scan driver 130 (or the third scan driver 136) may supply a third scan signal GC to the third scan line SL3i during the first period T1.

The scan driver 130 (or the fourth scan driver 138) may supply a fourth scan signal GB to the fourth scan line SL4i during the zeroth to third periods T0 to T3. The third period T3 may be a period included in a subsequent horizontal period (e.g., a period in which data signals are supplied to the pixels positioned on an i+1-th horizontal line).

The emission driver 150 may supply an emission control signal EM to the emission control line ELk during the zeroth to second period T0 to T2.

During the zeroth period T0, the voltage of the reference power Vref is supplied to the data line DLj. During the zeroth period T0, the voltage of the reference power Vref may be supplied to the first node included in the pixel PXij, and the voltage of the initialization power Vint may be supplied to the third node N3. During the zeroth period T0, the first node N1 may be initialized by the voltage of the reference power Vref, and the third node N3 may be initialized by the voltage of the initialization power Vint. The zeroth period T0 may be referred to as an initialization period.

The first period T1 may be a period in which a voltage corresponding to the threshold voltage of the first transistor M1 is stored in the second capacitor C2. The second period T2 may be referred to as a threshold voltage compensation period.

The second period T2 may be a period in which the voltage Vdata(i) of the data signal is supplied from the data line DLj to the pixel PXij. During the second period T2, a voltage corresponding to the data signal may be applied to the first node N1. The second period T2 may be referred to as a data write period.

During the third period T3, the first transistor M1 may control the amount of current to be supplied from the first driving power VDD to the initialization power Vint in response to the voltage of the first node N1. In this case, the light emitting element LD may be prevented from emitting light due to undesired current. The third period T3 may be referred to as a luminance control period.

During the fourth period T4, the first transistor M1 may control, in response to the voltage of the first node N1, the amount of current flowing from the first driving power VDD to the second driving power VSS via the light emitting element LD. During the fourth period T4, the light emitting element LD may emit light at a luminance corresponding to the amount of current. The fourth period T4 may be referred to as an emission period.

FIGS. 6A to 6E illustrate an embodiment of a process of operating a pixel with the driving waveform of FIG. 5.

Figure 6A:
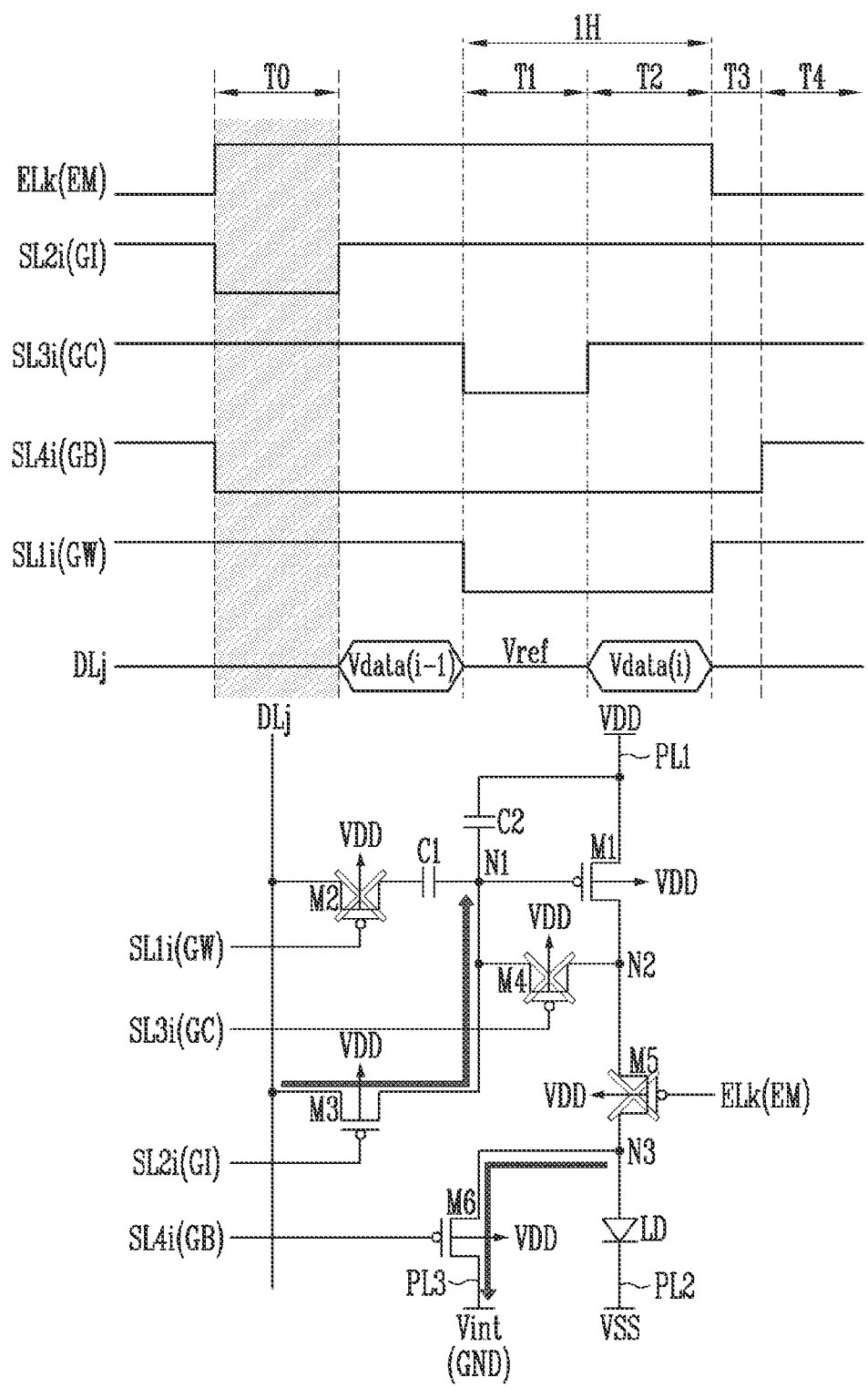
FIGS. 6A, 6B, 6C, 6D, and 6E are diagrams illustrating an embodiment of a process of operating the pixel corresponding to the driving waveform of FIG. 5.

Referring to FIG. 6A, during the zeroth to second periods T0 to T2, an emission control signal EM is supplied to the emission control line ELk, whereby the fifth transistor M5 is turned off. If the fifth transistor M5 is turned off, the first transistor M1 and the light emitting element LD may be electrically disconnected from each other, so that the light emitting element LD can be set to be in a non-emission state.

During the zeroth to third periods T0 to T3, a fourth scan signal GB is supplied to the fourth scan line SL4i. If the fourth scan signal GB is supplied to the fourth scan line SL4i, the sixth transistor M6 is turned on. If the sixth transistor M6 is turned on, the voltage of the initialization power Vint is supplied to the third node N3.

If the voltage of the initialization power Vint is supplied to the third node N3, the light emitting element LD may be initialized by the voltage of the initialization power Vint. Here, the initialization power Vint may be set to a voltage at which the light emitting element LD does not emit light. As a result, the light emitting element LD may be set to a non-emission state. For example, a voltage acquired by subtracting the second driving power VSS from the sum of the voltage of the initialization power Vint and the absolute threshold voltage of the fifth transistor M5 may be set to a value lower than the threshold voltage of the light emitting element LD. For example, the initialization power Vint may be set to the ground potential GND.

During the zeroth period T0, a second scan signal GI is supplied to the second scan line SL2i. If the second scan signal GI is supplied to the second scan line SL2i, the third transistor M3 is turned on. As a result, the voltage of the reference power Vref is supplied from the data line DLj to the first node N1. Here, the voltage of the first node N1 may be initialized to the voltage of the reference power Vref, regardless of a voltage supplied during a previous period (or a previous frame period).

A voltage Vdata(i-1) of a data signal may be supplied to the data line DLj between the end of the zeroth period T0 and the beginning of the first period T1. Here, because the second transistor M2 included in the pixel PXij is set to a turn-off state, the voltage Vdata(i-1) of the data signal is not supplied to the pixel PXij.

Figure 6B:
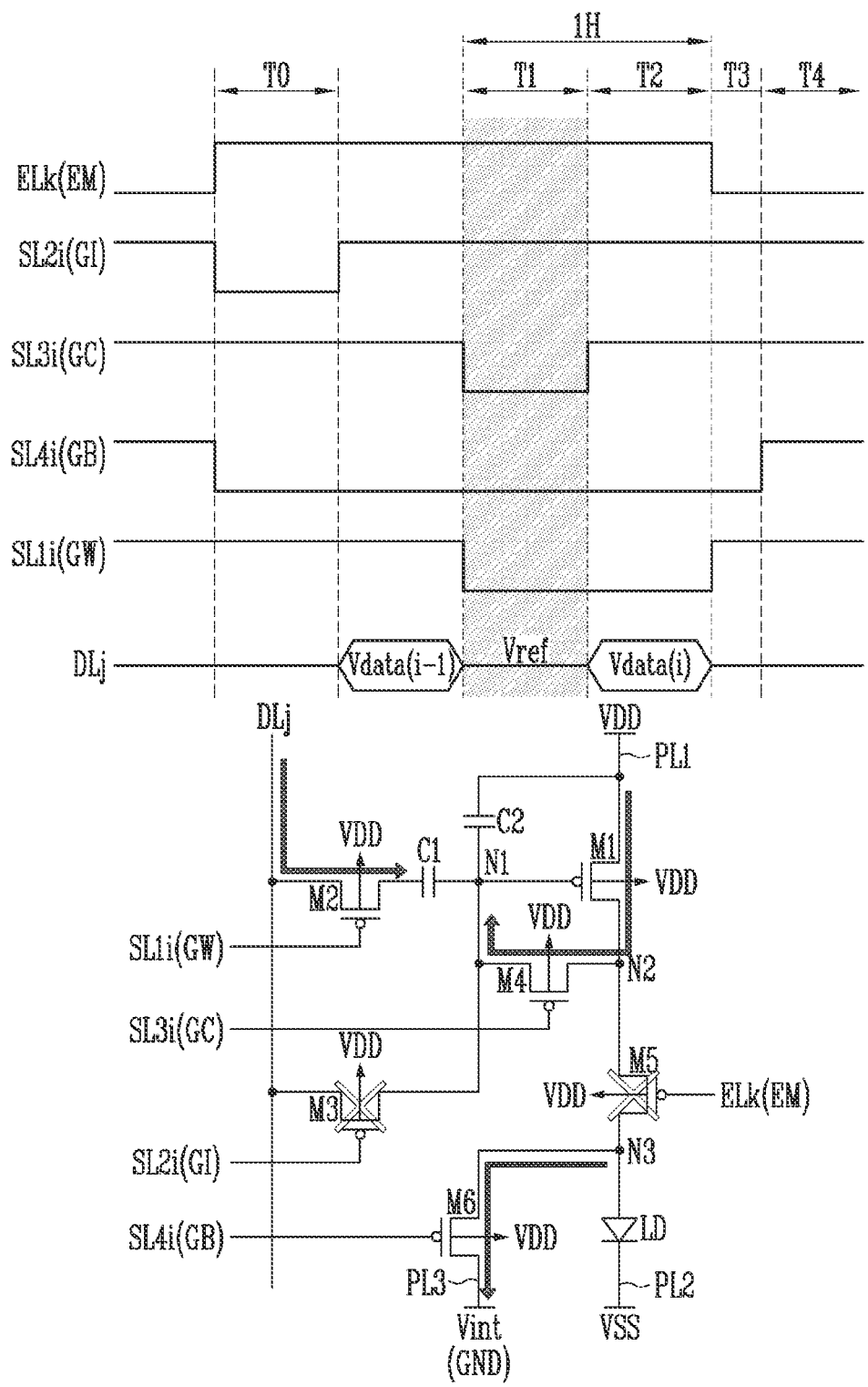

Referring to FIG. 6B, during the first period T1, the third scan signal GC is supplied to the third scan line SL3i, and the first scan signal GW is supplied to the first scan line SL1i.

If the first scan signal GW is supplied to the first scan line SL1i, the second transistor M2 is turned on. If the second transistor M2 is turned on, the voltage of the reference power Vref is supplied from the data line DLj to the first electrode of the first capacitor C1.

If the third scan signal GC is supplied to the third scan line SL3i, the fourth transistor M4 is turned on. If the fourth transistor M4 is turned on, the first transistor M1 is connected to form a diode. If the first transistor M1 is connected in the form of a diode, a voltage acquired by subtracting the absolute threshold voltage of the first transistor M1 from the first driving power VDD may be applied to the first node N1.

During the first period T1, the voltage of the reference power Vref is applied to the first electrode of the first capacitor C1, and a voltage acquired by subtracting the absolute threshold voltage of the first transistor M1 from the first driving power VDD may be applied to the second electrode of the first capacitor C1. In this case, regardless of a voltage supplied during a previous period (or a previous frame period), the first capacitor C1 may be initialized by the reference power Vref and the voltage acquired by subtracting the absolute threshold voltage of the first transistor M1 from the first driving power VDD. Furthermore, during the first period T1, a voltage corresponding to the threshold voltage of the first transistor M1 may be stored in each of the first capacitor C1 and the second capacitor C2.

Figure 6C:
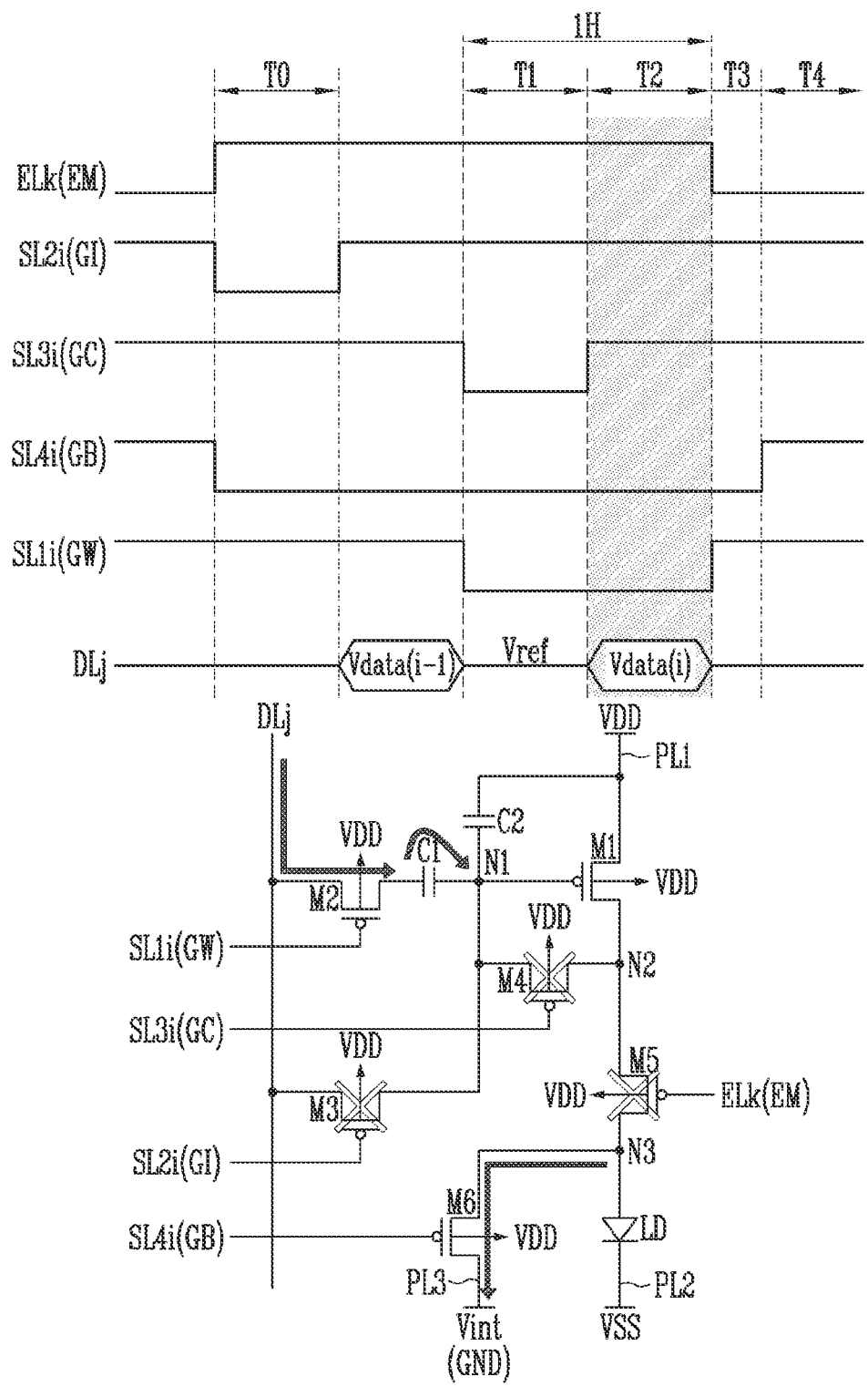

Referring to FIG. 6C, during the second period T2, the first scan signal GW is supplied to the first scan line SL1i, so that the second transistor M2 may remain turned on.

If the second transistor M2 is set to a turn-on state, a voltage Vdata(i) of a data signal is supplied from the data line DLj to the first electrode of the first capacitor C1. If the voltage Vdata(i) of the data signal is supplied to the first electrode of the first capacitor C1, the first electrode of the first capacitor C1 changes from the voltage of the reference power Vref to the voltage Vdata(i) of the data signal. In this case, the voltage of the first node N1 may also change due to the coupling of the first capacitor C1.

Here, voltage variation of the first node N1 may be determined in response to a ratio of the first capacitor C1 and the second capacitor C2. For example, the voltage of the first node N1 may change from the voltage obtained by subtracting the absolute threshold voltage of the first transistor M1 from the first driving power VDD, by a value resulting from multiplying the voltage variation of the first electrode of the first capacitor C1 by c1/(c1+c2) where c1 is a first capacitance of the first capacitor C1 and c2 is a second capacitance of the second capacitor C2. In the case where the voltage variation of the first node N1 is controlled by the ratio of the first capacitance c1 and the second capacitance c2, the voltage range of the data signal may be sufficiently widened.

For example, in the case where the data signal is directly supplied to the gate electrode of the first transistor M1, the voltage range of the data signal may be set to a relatively small range. In the case where the data signal has a small voltage range, there is a need to implement various grayscale values (e.g., 256 values) using a small voltage range. Consequently, it becomes difficult to represent accurate grayscale values.

On the other hand, as described in embodiments of the present disclosure, in the case where a voltage to be supplied to the gate electrode of the first transistor M1 is controlled by the ratio of the first capacitance and the second capacitance c2, the voltage range of the data signal may be set to a sufficient large range. For example, a voltage corresponding to a value obtained by multiplying the voltage of the data signal by c1/(c1+c2) is transmitted to the gate electrode of the first transistor M1. Consequently, the voltage range of the data signal may be set to a larger range. In the case where the data signal has a larger voltage range, grayscale values may be more easily implemented and distinguished from each other.

During the second period T2, the second capacitor C2 stores the voltage of the first node N1. Here, the voltage of the first node N1 may be determined by the threshold voltage of the first transistor M1 and the voltage Vdata(i) of the data signal. Consequently, during the second period T2, a voltage corresponding to the data signal and the threshold voltage of the first transistor M1 may be stored in the second capacitor C2.

Figure 6D:
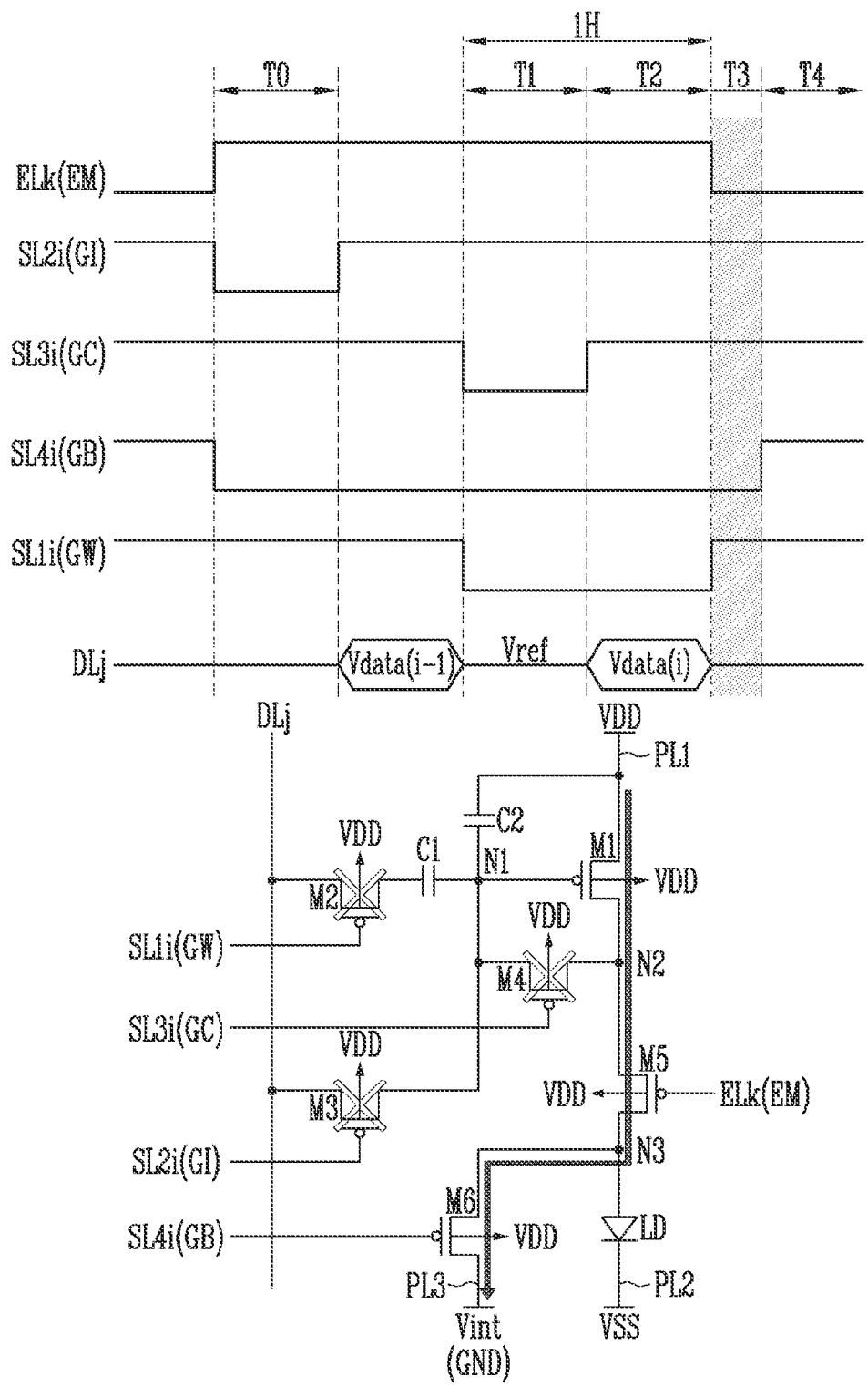

Referring to FIG. 6D, during the third period T3, the supply of the emission control signal EM to the emission control line ELk is interrupted. If the supply of the emission control signal EM to the emission control line ELk is interrupted, the fifth transistor M5 is turned on. If the fifth transistor M5 is turned on, the second node N2 and the third node N3 are electrically connected to each other.

During the third period T3, the fifth transistor M5 positioned on a current path for supplying current to the light emitting element LD is set to a turn-on state. Consequently, the first transistor M1 may control the amount of current to be supplied from the first driving power VDD to the third node N3 in response to the voltage applied to the first node N1. Here, because the sixth transistor M6 is set to a turn-on state, current supplied to the third node N3 may be supplied to the initialization power Vint. In other words, during the third period T3, the light emitting element LD may be set to a non-emission state, whereby the grayscale representation performance of the display device 100 may be improved by stabilization of driving current through the first and fifth transistors M1 and M5.

In more detail, as the first period T1 and the second period T2 elapse, the voltage of the second node N2 may be approximately set to the voltage of the first driving power VDD. In the case where the voltage of the second node N2 is set to the voltage of the first driving power VDD, unnecessary current may be supplied to the light emitting element LD after the fifth transistor M5 is turned on. For example, even when the pixel PXij implements a black grayscale, the light emitting element LD may emit light due to the voltage of the second node N2. Therefore, in an embodiment of the present disclosure, during the third period T3 before the light emitting element LD emits light, current supplied from the first transistor M1 may be provided to the initialization power Vint. Consequently, the grayscale representation performance of the display device 100 may be improved.

Figure 6E:
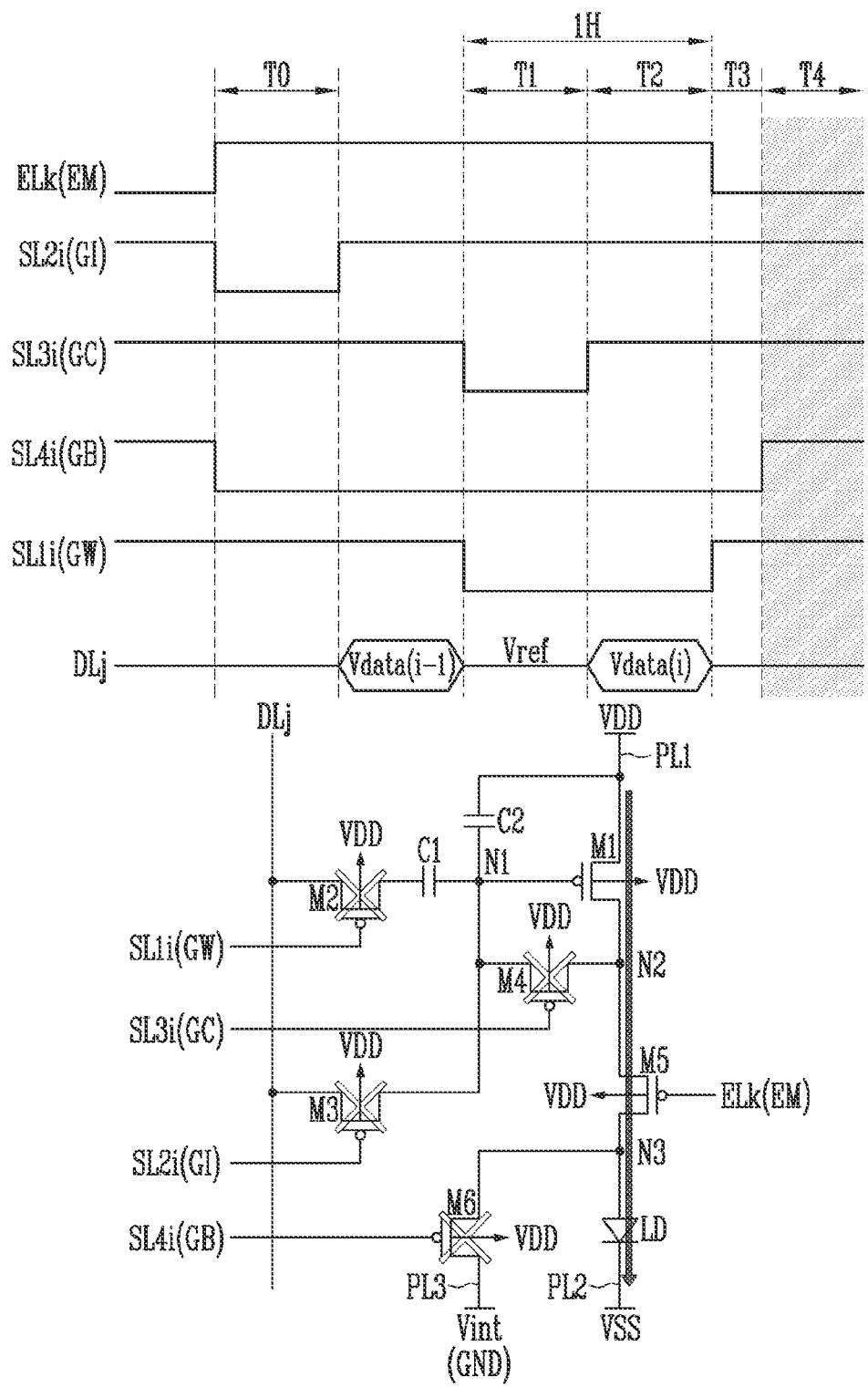

Referring to FIG. 6E, during the fourth period T4, the supply of the fourth scan signal GB to the fourth scan line SL4i is interrupted, so that the sixth transistor M6 is turned off. If the sixth transistor M6 is turned off, driving current supplied from the first transistor M1 is supplied to the light emitting element LD, so that the light emitting element LD can generate light of a luminance corresponding to the driving current.

In addition, the amount of current supplied from the first transistor M1 to the light emitting element LD during the fourth period T4 may be determined regardless of the threshold voltage of the first transistor M1, as shown in Equation 1.

$$ILD = K \times \left(\frac{C1}{C1+C2}\right)^2 \times (Vdata(i) - Vref)^2 \quad \text{[Equation 1]}$$

In Equation 1, ILD denotes the current supplied to the light emitting element LD, and K denotes the proportional constant determined by the mobility of the first transistor M1, parasitic capacitance, channel capacitance, and the like.

Referring to Equation 1, it can be understood that the amount of current supplied from the first transistor M1 is determined by the voltage Vdata(i) of the data signal and the reference power Vref, regardless of the threshold voltage of the first transistor M1.

In an embodiment of the present disclosure, the voltage of the first electrode of the first transistor M1 may be set to the same value during the first period T1 in which the threshold voltage of the first transistor M1 is compensated for and the fourth period T4 in which the light emitting element LD emits light. For example, during the first period T1 and the fourth period T4, the voltage of the first electrode of the first transistor M1 may be set to the voltage of the driving power VDD. In this case, the threshold voltage of the first transistor M1 may be reliably compensated for.

Figure 7:
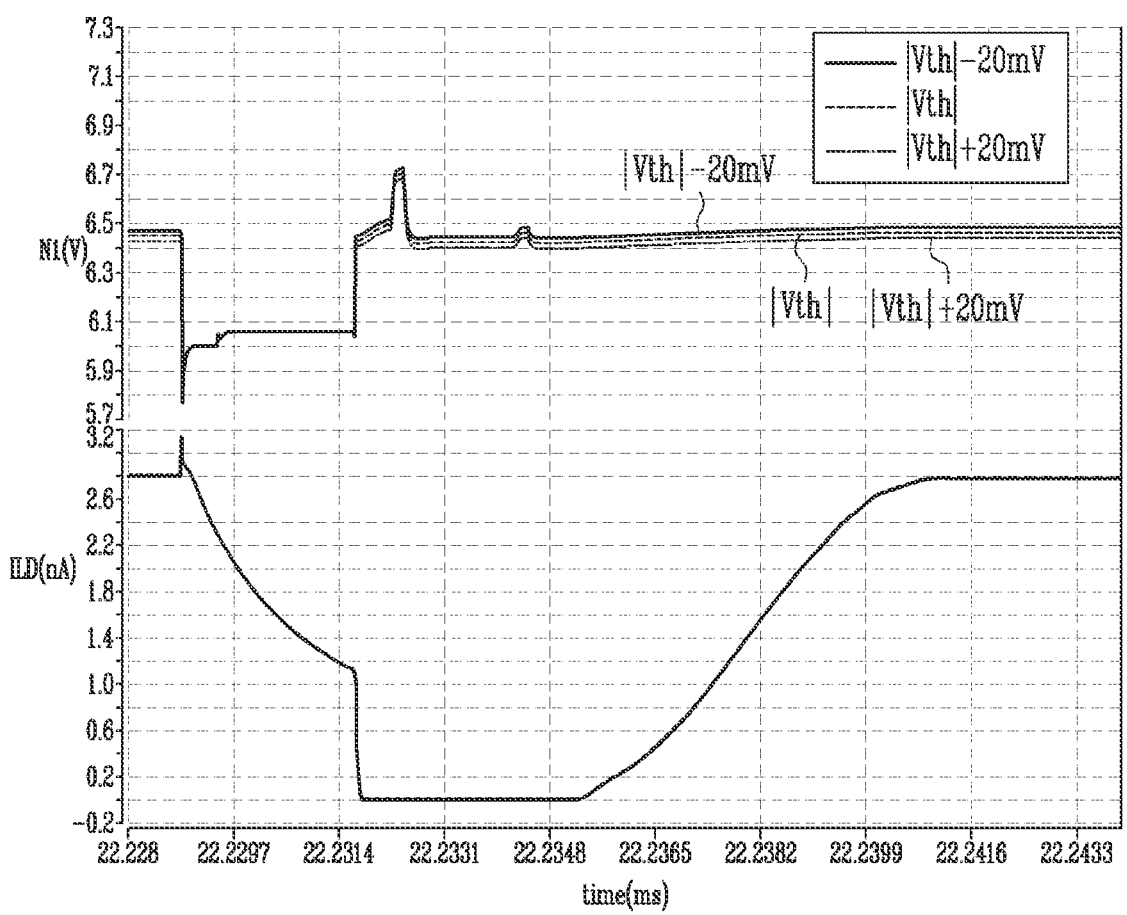
FIG. 7 is a diagram illustrating variation of driving current in response to changes in the threshold voltage of the first transistor in the pixel illustrated in FIG. 4.

FIG. 7 illustrates variation of driving current in response to changes in threshold voltage of the first transistor in the pixel illustrated in FIG. 4. In FIG. 7, the X-axis denotes time. In FIG. 7, the Y-axis of the first node N1 denotes voltage [V], and the Y-axis of the current ILD denotes current [nA].

FIG. 7 shows plots for cases where the threshold voltage of the first transistor M1 changes by approximately −20 mV and +20 mV from a nominal value and illustrates how the voltage of the first node N1 may change in response to the threshold voltage of the first transistor M1. In other words, the voltage of the first node N1 may change in response to the threshold voltage of the first transistor M1, whereby the threshold voltage of the first transistor M1 may be compensated for.

Furthermore, even if the threshold voltage of the first transistor M1 changes, current ILD supplied to the light emitting element LD may have an approximately similar (or identical) current value.

Figure 8:
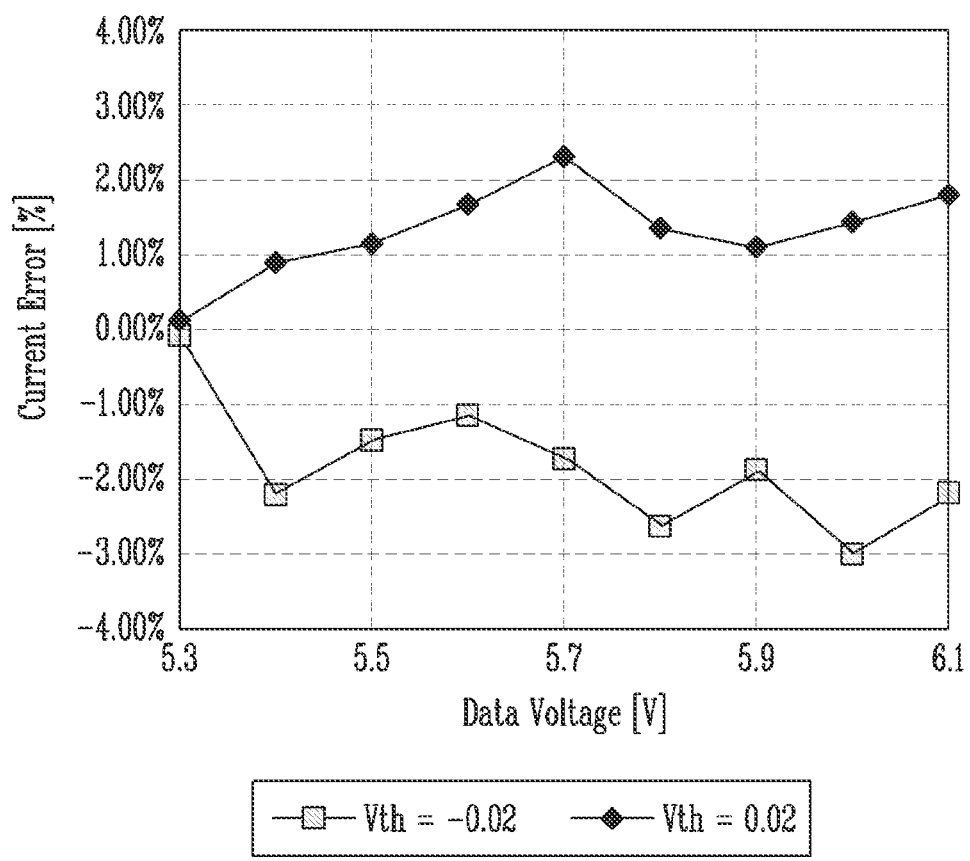
FIG. 8 is a diagram illustrating a current error of the pixel shown in FIG. 4.

FIG. 8 illustrates a current error of the pixel shown in FIG. 4. In FIG. 8, the X-axis denotes the voltage of the data signal (or a grayscale value), and the Y-axis denotes the current error. The current error is expressed as a percentage [%] and represents variation in driving current in response to a change in threshold voltage of the first transistor M1. For example, FIG. 8 illustrates the current error when the threshold voltage of the first transistor M1 changes by −0.02 V or 0.02V.

Referring to FIG. 8, when the threshold voltage of the first transistor M1 changes by −0.02 V and 0.02 V, the current error may be only up to approximately −3% to 2.2%. In other words, in the case of an embodiment of the present disclosure, the threshold voltage of the first transistor M1 may be reliably compensated for.

Figure 9:
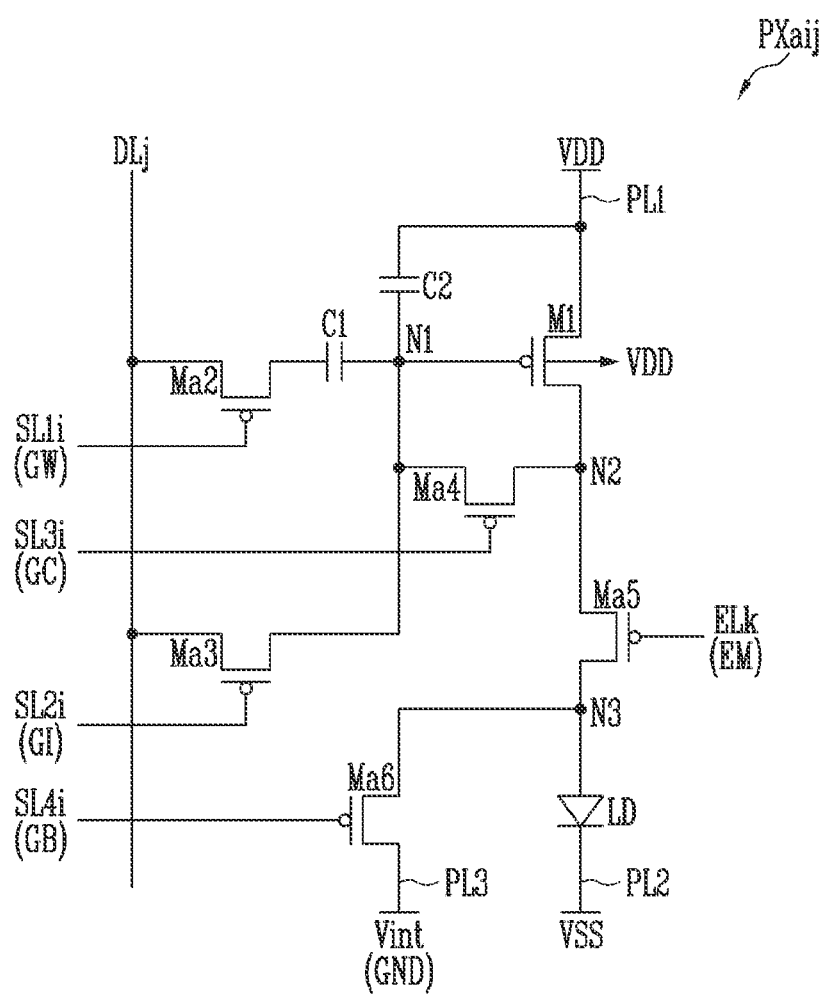
FIG. 9 is a diagram illustrating a pixel in accordance with an embodiment of the present disclosure.

FIG. 9 is a circuit diagram illustrating a pixel PXaij in accordance with an embodiment of the present disclosure. In the following description of FIG. 9, explanations that overlap the description of FIG. 4 will be omitted.

Referring to FIG. 9, the pixel PXaij in accordance with an embodiment of the present disclosure may be connected to corresponding signal lines SL1i, SL2i, SL3i, SL4i, ELk, and DLj. For example, the pixel PXaij may be connected to the i-th first scan line SL1i, the i-th second scan line SL2i, the i-th third scan line SL3i, the i-th fourth scan line SL4i, the emission control line ELk, and the j-th data line DLj. In an embodiment, the pixel PXaij may also be connected to the first power line PL1, the second power line PL2, and the third power line PL3.

The pixel PXaij in accordance with an embodiment of the present disclosure may include a pixel circuit and a light emitting element LD, and the pixel circuit may be configured to control the amount of current to be supplied to the light emitting element LD.

The light emitting element LD may be connected between the first power line PL1 and the second power line PL2. The light emitting element LD may generate light of a certain luminance corresponding to the amount of current that the pixel circuit supplies from the first power line PL1, through the light emitting element LD, to the second power line PL2.

The pixel circuit may include the first transistor M1, a second transistor Ma2, a third transistor Ma3, a fourth transistor Ma4, the fifth transistor Ma5, a sixth transistor Ma6, a first capacitor C1, and a second capacitor C2.

The first transistor M1 may be a MOSFET including a body electrode. In this case, the first transistor M1 may be mounted in a relatively small area, thus allowing the pixel PXaij to be applied to a high-resolution panel. The body electrode of the first transistor M1 may be supplied with the first driving power VDD. For example, the body electrode of the first transistor M1 may be electrically connected to the first power line PL1.

The second to sixth transistors Ma2 to Ma6 may be formed of transistors of a different type from that of the first transistor M1. For example, the second to sixth transistors Ma2 to Ma6 may be transistors that do not include a body electrode. For example, the second to sixth transistors Ma2 to Ma6 may be configured in various forms, including a thin film transistor (TFT), a field effect transistor (FET), a bipolar junction transistor (BIT), and so on.

A method of driving the pixel PXaij shown in FIG. 9 may be substantially the same as the method of driving the pixel PXij shown in FIG. 4; therefore, detailed explanation thereof will be omitted.

Figure 10:
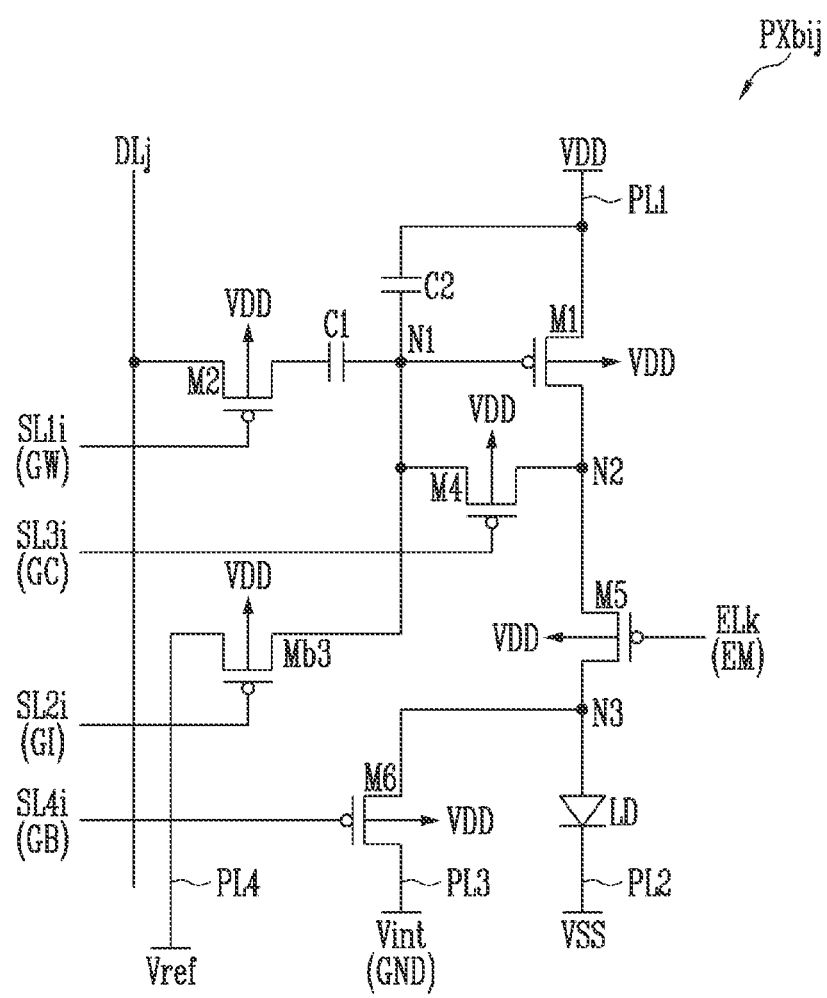
FIG. 10 is a diagram illustrating a pixel in accordance with an embodiment of the present disclosure.

FIG. 10 is a circuit diagram illustrating a pixel PXbij in accordance with an embodiment of the present disclosure. In the following description of FIG. 10, explanations that overlap the description of FIG. 4 will be omitted.

Referring to FIG. 10, the pixel PXbij in accordance with an embodiment of the present disclosure may be connected to corresponding signal lines SL1$i$, SL2$i$, SL3$i$, SL4$i$, ELk, and DLj. For example, the pixel PXbij may be connected to the i-th first scan line SL1$i$, the i-th second scan line SL2$i$, the i-th third scan line SL3$i$, the i-th fourth scan line SL4$i$, the emission control line ELk, and the j-th data line DLj. In an embodiment, the pixel PXbij may also be connected to the first power line PL1, the second power line PL2, the third power line PL3, and a fourth power line PL4.

The pixel PXbij in accordance with an embodiment of the present disclosure may include a pixel circuit and a light emitting element LD, and the pixel circuit may be configured to control the amount of current to be supplied to the light emitting element LD.

The light emitting element LD may be connected between the first power line PL1 and the second power line PL2. The light emitting element LD may generate light of a certain luminance corresponding to the amount of current that that the pixel circuit supplies from the first power line PL1, through the light emitting element LD, to the second power line PL2.

The pixel circuit may include a first transistor M1, a second transistor M2, a third transistor Mb3, a fourth transistor M4, a fifth transistor M5, a sixth transistor M6, a first capacitor C1, and a second capacitor C2.

The third transistor Mb3 may include a first electrode connected to the first node N1, and a second electrode electrically connected to the fourth power line PL4, to which the voltage of the reference power Vref is supplied. A gate electrode of the third transistor Mb3 may be electrically connected to the second scan line SL2$i$. When a second scan signal GI is supplied to the second scan line SL2$i$, the third transistor Mb3 may be turned on so that the voltage of the reference power Vref can be supplied to the first node N1.

The third transistor Mb3, other than being connected to the reference power Vref, may be substantially the same operating process as the third transistor M3 shown in FIG. 4.

Figure 11:
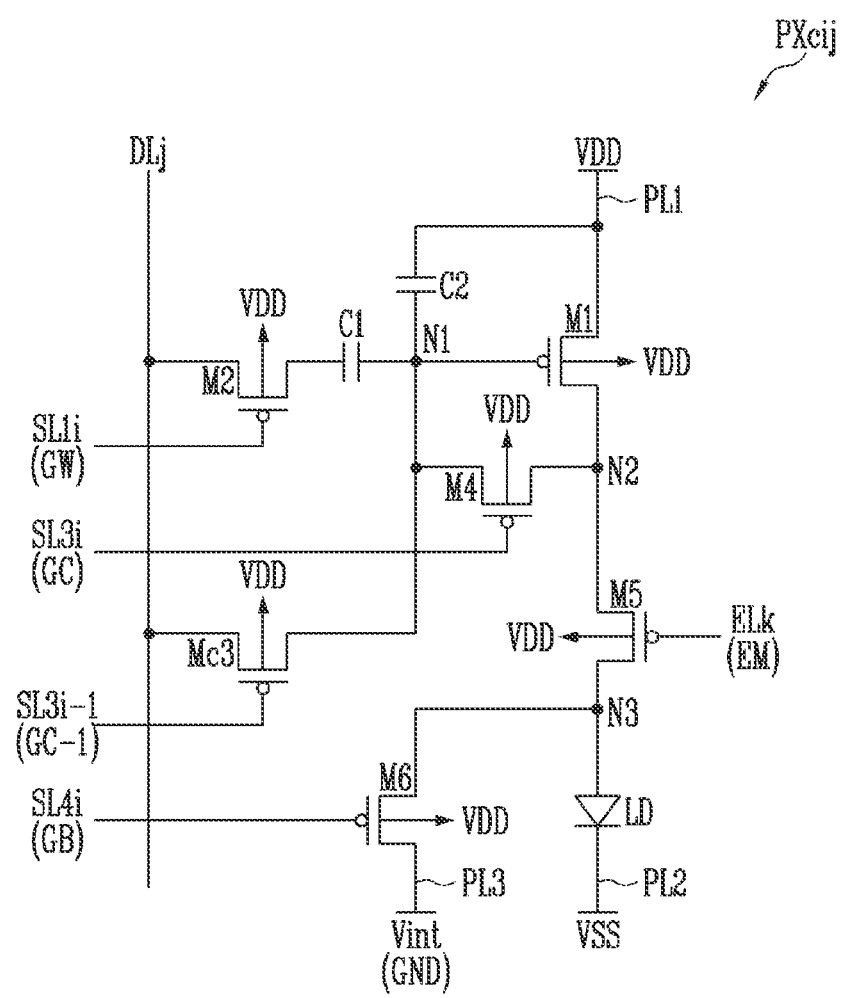
FIG. 11 is a diagram illustrating a pixel in accordance with an embodiment of the present disclosure.

FIG. 11 is a circuit diagram illustrating a pixel PXcij in accordance with an embodiment of the present disclosure. In the following description of FIG. 11, explanations that overlap the description of FIG. 4 will be omitted.

Referring to FIG. 11, the pixel PXcij in accordance with an embodiment of the present disclosure may be connected to corresponding signal lines SL1$i$, SL3$i$-1, SL3$i$, SL4$i$, ELk, and DLj. For example, the pixel PXcij may be connected to the i-th first scan line SL1$i$, an i-1-th third scan line SL3$i$-1, the i-th third scan line SL3$i$, the i-th fourth scan line SL4$i$, the emission control line Elk, and the j-th data line DLj. In an embodiment, the pixel PXcij may also be connected to the first power line PL1, the second power line PL2, and the third power line PL3.

The pixel PXcij in accordance with an embodiment of the present disclosure may include a pixel circuit and a light emitting element LD, and the pixel circuit may be configured to control the amount of current to be supplied to the light emitting element LD.

The light emitting element LD may be connected between the first power line PL1 and the second power line PL2. The light emitting element LD may generate light of certain luminance corresponding to the amount of current that the pixel circuit supplies from the first power line PL1, through the light emitting element LD, to the second power line PL2.

The pixel circuit may include a first transistor M1, a second transistor M2, a third transistor Mc3, a fourth transistor M4, a fifth transistor M5, a sixth transistor M6, a first capacitor C1, and a second capacitor C2.

The third transistor Mc3 may be connected between the data line DLj and the first node N1. A gate electrode of the third transistor Mc3 may be coupled to an i-1-th third scan line SL3$i$-1. When a third scan signal GC-1 is supplied to the i-1-th third scan line SL3$i$-1, the third transistor Mc3 may be turned on to electrically connect the data line DLj with the first node N1.

In other words, the connection to the second scan line SL2$i$ in the pixel PXij illustrated in FIG. 4 may be replaced with the connection to the i-1-th third scan line SL3$i$-1 for the previous horizontal line, as illustrated in FIG. 11. In this case, the second scan line SL2$i$ may be removed, and the display device 100 of FIG. 2 may not require the second scan lines SL2. A method of driving the pixel PXcij shown in FIG. 11 may be substantially the same as the pixel PXij shown in FIG. 4; therefore, detailed explanation thereof will be omitted.

In accordance with a pixel and a display device including the pixel in accordance with embodiments of the present disclosure, the pixel may be implemented using a transistor {e.g., a metal-oxide-semiconductor field-effect transistor (MOSFET)} suitable for high resolution.

Furthermore, the pixel in accordance with embodiments of the present disclosure may include a driving transistor having a body electrode. The threshold voltage of the driving transistor may be reliably compensated for.

In addition, the pixel in accordance with embodiments of the present disclosure may transmit data signals using capacitor coupling, whereby a voltage range of the data signal may be a relatively large range.

However, effects of the present disclosure are not limited to the above-described effects, and various modifications are possible without departing from the spirit and scope of the present disclosure.

While embodiments of the present disclosure have been described above, those skilled in the art will appreciate that various modifications, additions and substitutions are possible, without departing from the scope and spirit of the present disclosure claimed in the appended claims.

What is claimed is:
1. A pixel comprising:
a first transistor including a second electrode, a first electrode electrically connected to a first power line, and a gate electrode connected to a first node;
a second transistor including a second electrode, a first electrode electrically connected to a data line, and a gate electrode electrically connected to a first scan line;

a third transistor connected between the first node and the data line, the third transistor including a gate electrode electrically connected to a second scan line;

a first capacitor including a first electrode connected to the second electrode of the second transistor, and a second electrode connected to the first node;

a second capacitor connected between the first power line and the first node; and a light emitting element between a second power line and the first transistor, the light emitting element including a second electrode electrically connected to the second power line.

2. The pixel according to claim 1, wherein the first transistor comprises a metal-oxide-semiconductor field-effect transistor (MOSFET) including a body electrode.

3. The pixel according to claim 2, wherein a voltage of first driving power is supplied to the first power line, and the voltage of the first driving power is supplied to the body electrode.

4. The pixel according to claim 1, further comprising:
a fourth transistor connected between the first node and a second node that is connected to the second electrode of the first transistor, the fourth transistor including a gate electrode electrically connected to a third scan line;

a fifth transistor connected between the second node and a first electrode of the light emitting element, the fifth transistor including a gate electrode electrically connected to an emission control line; and a sixth transistor including a first electrode electrically connected to the first electrode of the light emitting element, a second electrode electrically connected to a third power line, and a gate electrode electrically connected to a fourth scan line.

5. The pixel according to claim 4, wherein each of the first to the sixth transistors comprises a metal-oxide-semiconductor field-effect transistor (MOSFET) including a body electrode.

6. The pixel according to claim 5, wherein a voltage of first driving power is supplied to the first power line, and the voltage of the first driving power is supplied to the body electrodes of the MOSFETs.

7. The pixel according to claim 4, wherein the second scan line is set to a third scan line positioned on a previous horizontal line.

8. The pixel according to claim 4,
wherein first driving power is supplied to the first power line,
wherein second driving power having a voltage value lower than the first driving power is supplied to the second power line, and
wherein initialization power having a voltage value at which the light emitting element does not emit light is supplied to the third power line.

9. The pixel according to claim 8, wherein a voltage value acquired by subtracting the second driving power from a voltage obtained by adding an absolute threshold voltage of the fifth transistor to a voltage of the initialization power is set to a voltage lower than a threshold voltage of the light emitting element.

10. The pixel according to claim 9, wherein the initialization power is set to ground power (GND).

11. The pixel according to claim 8,
wherein a single horizontal period of operation of the pixel includes a first period and a second period,
wherein reference power having a voltage value between the first driving power and the second driving power is supplied to the data line during the first period, and a voltage of a data signal is supplied to the data line during the second period, wherein, during the first period, the second transistor, the fourth transistor, and the sixth transistor are set to a turn-on state, and the third transistor and the fifth transistor are set to a turn-off state, and wherein, during the second period, the second transistor and the sixth transistor are set to the turn-on state, and the third transistor, the fourth transistor, and the fifth transistor are set to the turn-off state.

12. The pixel according to claim 11,
wherein during a zeroth period before the first period, the third transistor and the sixth transistor are set to the turn-on state, and the second transistor, the fourth transistor, and the fifth transistor are set to the turn-off state, and wherein, during the zeroth period, a voltage of the reference power is supplied to the data line.

13. The pixel according to claim 11,
wherein during a third period after the second period, the first transistor, the fifth transistor, and the sixth transistor are set to the turn-on state, and the second transistor, the third transistor, and the fourth transistor are set to the turn-off state, and wherein, during a fourth period after the third period, the first transistor and the fifth transistor are set to the turn-on state, and the second transistor, the third transistor, the fourth transistor, and the sixth transistor are set to the turn-off state.

14. A pixel comprising:
a light emitting element including a second electrode electrically connected to a second power line;

a first transistor including a second electrode, a first electrode electrically connected to a first power line, and a gate electrode connected to a first node;

a second transistor including a second electrode, a first electrode electrically connected to a data line, and a gate electrode electrically connected to a first scan line;

a third transistor including a first electrode connected to the first node, a second electrode electrically connected to a fourth power line to which a voltage of reference power is supplied, and a gate electrode electrically connected to the second scan line;

a fourth transistor connected between the first node and a second node connected to the second electrode of the first transistor, the fourth transistor including a gate electrode electrically connected to a third scan line;

a fifth transistor connected between the second node and a first electrode of the light emitting element, the fifth transistor including a gate electrode electrically connected to an emission control line;

a sixth transistor including a first electrode electrically connected to the first electrode of the light emitting element, a second electrode electrically connected to a third power line, and a gate electrode electrically connected to a fourth scan line;

a first capacitor connected between the second electrode of the second transistor and the first node; and a second capacitor connected between the first power line and the first node.

15. A display device, comprising pixels connected to first scan lines, second scan lines, third scan lines, fourth scan lines, data lines, and emission control lines,
wherein, among the pixels, a pixel positioned on an i-th pixel row (i is an integer of 0 or more) and a j-th pixel column (j is an integer of 0 or more) comprises:

a first transistor including a second electrode, a first electrode electrically connected to a first power line, and a gate electrode connected to a first node;

a second transistor including a second electrode, and a first electrode electrically connected to a j-th data line, the second transistor being configured to be turned on when a first scan signal is supplied to an i-th first scan line;

a third transistor connected between the first node and the j-th data line, the third transistor being configured to be turned on when a second scan signal is supplied to an i-th second scan line;

a first capacitor connected between the second electrode of the second transistor and the first node;

a second capacitor connected between the first power line and the first node; and a light emitting element between a second power line and the first transistor, the light emitting element including a second electrode electrically connected to the second power line.

16. The display device according to claim 15, wherein the first transistor is a metal-oxide-semiconductor field-effect transistor (MOSFET) including a body electrode, and the body electrode is electrically connected to the first power line.

17. The display device according to claim 15, wherein the pixel positioned on the i-th pixel row and the j-th pixel column further comprises:

a fourth transistor connected between a second node connected to the second electrode of the first transistor and the first node, the fourth transistor being configured to be turned on when a third scan signal is supplied to an i-th third scan line;

a fifth transistor connected between the second node and a first electrode of the light emitting element, the fifth transistor being configured to be turned off when an emission control signal is supplied to a k-th emission control line (where k is an integer of 0 or more); and a sixth transistor including a first electrode electrically connected to the first electrode of the light emitting element and a second electrode electrically connected to a third power line, the sixth transistor being configured to turned off when a fourth scan signal is supplied to an i-th fourth scan line.

18. The display device according to claim 17, wherein each of the first to the sixth transistors is set to a metal-oxide-semiconductor field-effect transistor (MOSFET) including a body electrode, and the body electrode is electrically connected to the first power line.

19. The display device according to claim 17, further comprising:

a data driver configured to supply a data signal to the data lines;

a first scan driver configured to supply the first scan signal to the first scan lines;

a second scan driver configured to supply the second scan signal to the second scan lines;

a third scan driver configured to supply the third scan signal to the third scan lines;

a fourth scan driver configured to supply the fourth scan signal to the fourth scan lines; and an emission driver configured to supply the emission control signal to the emission control lines.

20. The display device according to claim 19, wherein a horizontal period in which the pixel positioned on the i-th pixel row and the j-th pixel column is driven includes a first period and a second period, wherein the data driver supplies a voltage of reference power to the j-th data line during the first period and supplies the data signal to the j-th data line during the second period, wherein the first scan driver supplies the first scan signal to the i-th first scan line during the first period and the second period, wherein the second scan driver supplies the second scan signal to the i-th second scan line during a zeroth period before the first period, wherein the third scan driver supplies the third scan signal to the i-th third scan line during the first period, wherein the fourth scan driver supplies the fourth scan signal to the i-th fourth scan line during the zeroth period, the first period, the second period, and a third period after the second period, and wherein the emission driver supplies the emission control signal to the k-th emission control line during the zeroth period, the first period, and the second period.

* * * * *